United States Patent
Vorbach et al.

(10) Patent No.: US 8,250,503 B2
(45) Date of Patent: Aug. 21, 2012

(54) HARDWARE DEFINITION METHOD INCLUDING DETERMINING WHETHER TO IMPLEMENT A FUNCTION AS HARDWARE OR SOFTWARE

(76) Inventors: Martin Vorbach, Lingenfeld (DE); Frank May, Munich (DE)

( * ) Notice: Subject to any disclaimer, the term of this patent is extended or adjusted under 35 U.S.C. 154(b) by 797 days.

(21) Appl. No.: 12/087,916

(22) PCT Filed: Jan. 17, 2007

(86) PCT No.: PCT/EP2007/000380
§ 371 (c)(1),
(2), (4) Date: Dec. 2, 2008

(87) PCT Pub. No.: WO2007/082730
PCT Pub. Date: Jul. 26, 2007

(65) Prior Publication Data
US 2009/0199167 A1    Aug. 6, 2009

(30) Foreign Application Priority Data

Jan. 18, 2006 (EP) .................................... 06001043
Jan. 18, 2006 (EP) .................................... 06400003
Jan. 23, 2006 (DE) ......................... 10 2006 003 275
Jan. 27, 2006 (DE) ......................... 10 2006 004 151

(51) Int. Cl.
*G06F 17/50* (2006.01)
(52) U.S. Cl. ....................................... 716/104; 716/103
(58) Field of Classification Search ........... 716/101–104
See application file for complete search history.

(56) References Cited

U.S. PATENT DOCUMENTS

| | | |
|---|---|---|
| 2,067,477 A | 1/1937 | Cooper |
| 3,242,998 A | 3/1966 | Gubbins |
| 3,564,506 A | 2/1971 | Bee et al. |
| 3,681,578 A | 8/1972 | Stevens |
| 3,753,008 A | 8/1973 | Guarnaschelli |
| 3,855,577 A | 12/1974 | Vandierendonck |
| 4,151,611 A | 4/1979 | Sugawara et al. |
| 4,233,667 A | 11/1980 | Devine et al. |
| 4,414,547 A | 11/1983 | Knapp et al. |
| 4,498,134 A | 2/1985 | Hansen et al. |
| 4,498,172 A | 2/1985 | Bhavsar |
| 4,566,102 A | 1/1986 | Hefner |
| 4,571,736 A | 2/1986 | Agrawal et al. |
| 4,590,583 A | 5/1986 | Miller |
| 4,591,979 A | 5/1986 | Iwashita |

(Continued)

FOREIGN PATENT DOCUMENTS

DE    42 21 278    1/1994

(Continued)

OTHER PUBLICATIONS

U.S. Appl. No. 60/109,417, filed Nov. 18, 1998, Jefferson et al.

(Continued)

*Primary Examiner* — Vuthe Siek
(74) *Attorney, Agent, or Firm* — Kenyon & Kenyon LLP

(57) ABSTRACT

A hardware definition system and method includes a computer processor analyzing software function modules of a software program, and generating, for each of at least a subset of the software function modules, and on the basis of the analyzing step, a respective setting indicating whether the respective function module is to be implemented as a respective hardware module or as a software module executed on a hardware module defined in a hardware module library.

55 Claims, 9 Drawing Sheets

U.S. PATENT DOCUMENTS

| | | |
|---|---|---|
| 4,594,682 A | 6/1986 | Drimak |
| 4,663,706 A | 5/1987 | Allen et al. |
| 4,667,190 A | 5/1987 | Fant et al. |
| 4,682,284 A | 7/1987 | Schrofer |
| 4,686,386 A | 8/1987 | Tadao |
| 4,706,216 A | 11/1987 | Carter |
| 4,720,778 A | 1/1988 | Hall et al. |
| 4,720,780 A | 1/1988 | Dolecek |
| 4,739,474 A | 4/1988 | Holsztynski |
| 4,761,755 A | 8/1988 | Ardini et al. |
| 4,791,603 A | 12/1988 | Henry |
| 4,811,214 A | 3/1989 | Nosenchuck et al. |
| 4,852,043 A | 7/1989 | Guest |
| 4,852,048 A | 7/1989 | Morton |
| 4,860,201 A | 8/1989 | Stolfo et al. |
| 4,870,302 A | 9/1989 | Freeman |
| 4,873,666 A | 10/1989 | Lefebvre et al. |
| 4,882,687 A | 11/1989 | Gordon |
| 4,884,231 A | 11/1989 | Mor et al. |
| 4,891,810 A | 1/1990 | de Corlieu et al. |
| 4,901,268 A | 2/1990 | Judd |
| 4,910,665 A | 3/1990 | Mattheyses et al. |
| 4,918,440 A | 4/1990 | Furtek et al. |
| 4,939,641 A | 7/1990 | Schwartz et al. |
| 4,959,781 A | 9/1990 | Rubenstein et al. |
| 4,967,340 A | 10/1990 | Dawes |
| 4,972,314 A | 11/1990 | Getzinger et al. |
| 4,992,933 A | 2/1991 | Taylor |
| 5,010,401 A | 4/1991 | Murakami et al. |
| 5,014,193 A | 5/1991 | Garner et al. |
| 5,015,884 A | 5/1991 | Agrawal et al. |
| 5,021,947 A | 6/1991 | Campbell et al. |
| 5,023,775 A | 6/1991 | Poret |
| 5,034,914 A | 7/1991 | Osterlund |
| 5,036,473 A | 7/1991 | Butts et al. |
| 5,036,493 A | 7/1991 | Nielsen |
| 5,041,924 A | 8/1991 | Blackborow et al. |
| 5,043,978 A | 8/1991 | Nagler et al. |
| 5,047,924 A | 9/1991 | Fujioka et al. |
| 5,055,997 A | 10/1991 | Sluijter et al. |
| 5,065,308 A | 11/1991 | Evans |
| 5,072,178 A | 12/1991 | Matsumoto |
| 5,081,375 A | 1/1992 | Pickett et al. |
| 5,099,447 A | 3/1992 | Myszewski |
| 5,103,311 A | 4/1992 | Sluijter et al. |
| 5,109,503 A | 4/1992 | Cruickshank et al. |
| 5,113,498 A | 5/1992 | Evan et al. |
| 5,115,510 A | 5/1992 | Okamoto et al. |
| 5,119,290 A | 6/1992 | Loo et al. |
| 5,123,109 A | 6/1992 | Hillis |
| 5,125,801 A | 6/1992 | Nabity et al. |
| 5,128,559 A | 7/1992 | Steele |
| 5,142,469 A | 8/1992 | Weisenborn |
| 5,144,166 A | 9/1992 | Camarota et al. |
| 5,193,202 A | 3/1993 | Jackson et al. |
| 5,203,005 A | 4/1993 | Horst |
| 5,204,935 A | 4/1993 | Mihara et al. |
| 5,208,491 A | 5/1993 | Ebeling et al. |
| 5,212,716 A | 5/1993 | Ferraiolo et al. |
| 5,212,777 A | 5/1993 | Gove et al. |
| 5,218,302 A | 6/1993 | Loewe et al. |
| 5,226,122 A | 7/1993 | Thayer et al. |
| RE34,363 E | 8/1993 | Freeman |
| 5,233,539 A | 8/1993 | Agrawal et al. |
| 5,237,686 A | 8/1993 | Asano et al. |
| 5,243,238 A | 9/1993 | Kean |
| 5,247,689 A | 9/1993 | Ewert |
| RE34,444 E | 11/1993 | Kaplinsky |
| 5,274,593 A | 12/1993 | Proebsting |
| 5,276,836 A | 1/1994 | Fukumaru et al. |
| 5,287,472 A | 2/1994 | Horst |
| 5,287,511 A | 2/1994 | Robinson et al. |
| 5,287,532 A | 2/1994 | Hunt |
| 5,294,119 A | 3/1994 | Vincent et al. |
| 5,301,284 A | 4/1994 | Estes et al. |
| 5,301,344 A | 4/1994 | Kolchinsky |
| 5,303,172 A | 4/1994 | Magar et al. |
| 5,311,079 A | 5/1994 | Ditlow et al. |
| 5,327,125 A | 7/1994 | Iwase et al. |
| 5,336,950 A | 8/1994 | Popli et al. |
| 5,343,406 A | 8/1994 | Freeman et al. |
| 5,347,639 A | 9/1994 | Rechtschaffen et al. |
| 5,349,193 A | 9/1994 | Mott et al. |
| 5,353,432 A | 10/1994 | Richek et al. |
| 5,355,508 A | 10/1994 | Kan |
| 5,361,373 A | 11/1994 | Gilson |
| 5,365,125 A | 11/1994 | Goetting et al. |
| 5,379,444 A | 1/1995 | Mumme |
| 5,386,154 A | 1/1995 | Goetting et al. |
| 5,386,518 A | 1/1995 | Reagle et al. |
| 5,392,437 A | 2/1995 | Matter et al. |
| 5,408,643 A | 4/1995 | Katayose |
| 5,410,723 A | 4/1995 | Schmidt et al. |
| 5,412,795 A | 5/1995 | Larson |
| 5,418,952 A | 5/1995 | Morley et al. |
| 5,418,953 A | 5/1995 | Hunt et al. |
| 5,421,019 A | 5/1995 | Holsztynski et al. |
| 5,422,823 A | 6/1995 | Agrawal et al. |
| 5,425,036 A | 6/1995 | Liu et al. |
| 5,426,378 A | 6/1995 | Ong |
| 5,428,526 A | 6/1995 | Flood et al. |
| 5,430,687 A | 7/1995 | Hung et al. |
| 5,435,000 A | 7/1995 | Boothroyd et al. |
| 5,440,245 A | 8/1995 | Galbraith et al. |
| 5,440,538 A | 8/1995 | Olsen et al. |
| 5,442,790 A | 8/1995 | Nosenchuck |
| 5,444,394 A | 8/1995 | Watson et al. |
| 5,448,186 A | 9/1995 | Kawata |
| 5,450,022 A | 9/1995 | New |
| 5,455,525 A | 10/1995 | Ho et al. |
| 5,457,644 A | 10/1995 | McCollum |
| 5,465,375 A | 11/1995 | Thepaut et al. |
| 5,469,003 A | 11/1995 | Kean |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,475,856 A | 12/1995 | Kogge |
| 5,477,525 A | 12/1995 | Okabe |
| 5,483,620 A | 1/1996 | Pechanek et al. |
| 5,485,103 A | 1/1996 | Pedersen et al. |
| 5,485,104 A | 1/1996 | Agrawal et al. |
| 5,489,857 A | 2/1996 | Agrawal et al. |
| 5,491,353 A | 2/1996 | Kean |
| 5,493,239 A | 2/1996 | Zlotnick |
| 5,493,663 A | 2/1996 | Parikh |
| 5,497,498 A | 3/1996 | Taylor |
| 5,502,838 A | 3/1996 | Kikinis |
| 5,504,439 A | 4/1996 | Tavana |
| 5,506,998 A | 4/1996 | Kato et al. |
| 5,510,730 A | 4/1996 | El Gamal et al. |
| 5,511,173 A | 4/1996 | Yamaura et al. |
| 5,513,366 A | 4/1996 | Agarwal et al. |
| 5,521,837 A | 5/1996 | Frankle et al. |
| 5,522,083 A | 5/1996 | Gove et al. |
| 5,525,971 A | 6/1996 | Flynn |
| 5,530,873 A | 6/1996 | Takano |
| 5,530,946 A | 6/1996 | Bouvier et al. |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,580 A | 7/1996 | Giomi et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,550,782 A | 8/1996 | Cliff et al. |
| 5,555,434 A | 9/1996 | Carlstedt |
| 5,559,450 A | 9/1996 | Ngai et al. |
| 5,561,738 A | 10/1996 | Kinerk et al. |
| 5,568,624 A | 10/1996 | Sites et al. |
| 5,570,040 A | 10/1996 | Lytle et al. |
| 5,572,710 A | 11/1996 | Asano et al. |
| 5,574,927 A | 11/1996 | Scantlin |
| 5,574,930 A | 11/1996 | Halverson, Jr. et al. |
| 5,581,731 A | 12/1996 | King et al. |

| Patent No. | Date | Inventor |
|---|---|---|
| 5,581,734 A | 12/1996 | DiBrino et al. |
| 5,583,450 A | 12/1996 | Trimberger et al. |
| 5,584,013 A | 12/1996 | Cheong et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,590,348 A | 12/1996 | Phillips et al. |
| 5,596,742 A | 1/1997 | Agarwal et al. |
| 5,600,265 A | 2/1997 | El Gamal Abbas et al. |
| 5,600,597 A | 2/1997 | Kean et al. |
| 5,600,845 A | 2/1997 | Gilson |
| 5,602,999 A | 2/1997 | Hyatt |
| 5,606,698 A | 2/1997 | Powell |
| 5,608,342 A | 3/1997 | Trimberger |
| 5,611,049 A | 3/1997 | Pitts |
| 5,617,547 A | 4/1997 | Feeney et al. |
| 5,617,577 A | 4/1997 | Barker et al. |
| 5,619,720 A | 4/1997 | Garde et al. |
| 5,625,806 A | 4/1997 | Kromer |
| 5,625,836 A | 4/1997 | Barker et al. |
| 5,627,992 A | 5/1997 | Baror |
| 5,634,131 A | 5/1997 | Matter et al. |
| 5,635,851 A | 6/1997 | Tavana |
| 5,642,058 A | 6/1997 | Trimberger et al. |
| 5,646,544 A | 7/1997 | Iadanza |
| 5,646,545 A | 7/1997 | Trimberger et al. |
| 5,649,176 A | 7/1997 | Selvidge et al. |
| 5,649,179 A | 7/1997 | Steenstra et al. |
| 5,652,529 A | 7/1997 | Gould et al. |
| 5,652,894 A | 7/1997 | Hu et al. |
| 5,655,069 A | 8/1997 | Ogawara et al. |
| 5,655,124 A | 8/1997 | Lin |
| 5,656,950 A | 8/1997 | Duong et al. |
| 5,657,330 A | 8/1997 | Matsumoto |
| 5,659,785 A | 8/1997 | Pechanek et al. |
| 5,659,797 A | 8/1997 | Zandveld et al. |
| 5,675,262 A | 10/1997 | Duong et al. |
| 5,675,743 A | 10/1997 | Mavity |
| 5,675,757 A | 10/1997 | Davidson et al. |
| 5,675,777 A | 10/1997 | Glickman |
| 5,680,583 A | 10/1997 | Kuijsten |
| 5,682,491 A | 10/1997 | Pechanek et al. |
| 5,682,544 A | 10/1997 | Pechanek et al. |
| 5,687,325 A | 11/1997 | Chang |
| 5,694,602 A | 12/1997 | Smith |
| 5,696,791 A | 12/1997 | Yeung |
| 5,696,976 A | 12/1997 | Nizar et al. |
| 5,701,091 A | 12/1997 | Kean |
| 5,705,938 A | 1/1998 | Kean |
| 5,706,482 A | 1/1998 | Matsushima et al. |
| 5,713,037 A | 1/1998 | Wilkinson et al. |
| 5,717,890 A | 2/1998 | Ichida et al. |
| 5,717,943 A | 2/1998 | Barker et al. |
| 5,727,229 A | 3/1998 | Kan et al. |
| 5,732,209 A | 3/1998 | Vigil et al. |
| 5,734,869 A | 3/1998 | Chen |
| 5,734,921 A | 3/1998 | Dapp et al. |
| 5,737,516 A | 4/1998 | Circello et al. |
| 5,737,565 A | 4/1998 | Mayfield |
| 5,742,180 A | 4/1998 | DeHon et al. |
| 5,745,734 A | 4/1998 | Craft et al. |
| 5,748,872 A | 5/1998 | Norman |
| 5,748,979 A | 5/1998 | Trimberger |
| 5,752,035 A | 5/1998 | Trimberger |
| 5,754,459 A | 5/1998 | Telikepalli |
| 5,754,820 A | 5/1998 | Yamagami |
| 5,754,827 A | 5/1998 | Barbier et al. |
| 5,754,871 A | 5/1998 | Wilkinson et al. |
| 5,754,876 A | 5/1998 | Tamaki et al. |
| 5,760,602 A | 6/1998 | Tan |
| 5,761,484 A | 6/1998 | Agarwal et al. |
| 5,768,629 A | 6/1998 | Wise et al. |
| 5,773,994 A | 6/1998 | Jones |
| 5,778,439 A | 7/1998 | Timberger et al. |
| 5,781,756 A | 7/1998 | Hung |
| 5,784,313 A | 7/1998 | Trimberger et al. |
| 5,784,630 A | 7/1998 | Saito et al. |
| 5,784,636 A | 7/1998 | Rupp |
| 5,794,059 A | 8/1998 | Barker et al. |
| 5,794,062 A | 8/1998 | Baxter |
| 5,801,547 A | 9/1998 | Kean |
| 5,801,715 A | 9/1998 | Norman |
| 5,801,958 A | 9/1998 | Dangelo et al. |
| 5,802,290 A | 9/1998 | Casselman |
| 5,804,986 A | 9/1998 | Jones |
| 5,815,004 A | 9/1998 | Trimberger et al. |
| 5,815,715 A | 9/1998 | Kayhan |
| 5,815,726 A | 9/1998 | Cliff |
| 5,821,774 A | 10/1998 | Veytsman et al. |
| 5,828,229 A | 10/1998 | Cliff et al. |
| 5,828,858 A | 10/1998 | Athanas et al. |
| 5,831,448 A | 11/1998 | Kean |
| 5,832,288 A | 11/1998 | Wong |
| 5,838,165 A | 11/1998 | Chatter |
| 5,838,988 A | 11/1998 | Panwar et al. |
| 5,841,973 A | 11/1998 | Kessler et al. |
| 5,844,422 A | 12/1998 | Trimberger et al. |
| 5,844,888 A | 12/1998 | Markkula, Jr. et al. |
| 5,848,238 A | 12/1998 | Shimomura et al. |
| 5,854,918 A | 12/1998 | Baxter |
| 5,857,097 A | 1/1999 | Henzinger et al. |
| 5,857,109 A | 1/1999 | Taylor |
| 5,859,544 A | 1/1999 | Norman |
| 5,860,119 A | 1/1999 | Dockser |
| 5,862,403 A | 1/1999 | Kanai et al. |
| 5,865,239 A | 2/1999 | Carr |
| 5,867,691 A | 2/1999 | Shiraishi |
| 5,867,723 A | 2/1999 | Chin et al. |
| 5,870,620 A | 2/1999 | Kadosumi et al. |
| 5,884,075 A | 3/1999 | Hester et al. |
| 5,887,162 A | 3/1999 | Williams et al. |
| 5,887,165 A | 3/1999 | Martel et al. |
| 5,889,533 A | 3/1999 | Lee |
| 5,889,982 A | 3/1999 | Rodgers et al. |
| 5,892,370 A | 4/1999 | Eaton et al. |
| 5,892,961 A | 4/1999 | Trimberger |
| 5,892,962 A | 4/1999 | Cloutier |
| 5,894,565 A | 4/1999 | Furtek et al. |
| 5,895,487 A | 4/1999 | Boyd et al. |
| 5,898,602 A | 4/1999 | Rothman et al. |
| 5,901,279 A | 5/1999 | Davis, III |
| 5,915,099 A | 6/1999 | Takata et al. |
| 5,915,123 A | 6/1999 | Mirsky et al. |
| 5,924,119 A | 7/1999 | Sindhu et al. |
| 5,926,638 A | 7/1999 | Inoue |
| 5,927,423 A | 7/1999 | Wada et al. |
| 5,933,023 A | 8/1999 | Young |
| 5,933,642 A | 8/1999 | Greenbaum et al. |
| 5,936,424 A | 8/1999 | Young et al. |
| 5,943,242 A | 8/1999 | Vorbach et al. |
| 5,956,518 A | 9/1999 | DeHon et al. |
| 5,960,193 A | 9/1999 | Guttag et al. |
| 5,960,200 A | 9/1999 | Eager et al. |
| 5,966,143 A | 10/1999 | Breternitz, Jr. |
| 5,966,534 A | 10/1999 | Cooke et al. |
| 5,970,254 A | 10/1999 | Cooke et al. |
| 5,978,260 A | 11/1999 | Trimberger et al. |
| 5,978,583 A | 11/1999 | Ekanadham et al. |
| 5,996,048 A | 11/1999 | Cherabuddi et al. |
| 5,996,083 A | 11/1999 | Gupta et al. |
| 5,999,990 A | 12/1999 | Sharrit et al. |
| 6,003,143 A | 12/1999 | Kim et al. |
| 6,011,407 A | 1/2000 | New |
| 6,014,509 A | 1/2000 | Furtek et al. |
| 6,020,758 A | 2/2000 | Patel et al. |
| 6,020,760 A | 2/2000 | Sample et al. |
| 6,021,490 A | 2/2000 | Vorbach et al. |
| 6,023,564 A | 2/2000 | Trimberger |
| 6,023,742 A | 2/2000 | Ebeling et al. |
| 6,026,478 A | 2/2000 | Dowling |
| 6,026,481 A | 2/2000 | New et al. |
| 6,034,538 A | 3/2000 | Abramovici |
| 6,035,371 A | 3/2000 | Magloire |
| 6,038,650 A | 3/2000 | Vorbach et al. |
| 6,038,656 A | 3/2000 | Martin et al. |
| 6,044,030 A | 3/2000 | Zheng et al. |
| 6,047,115 A | 4/2000 | Mohan et al. |

| | | | | | | |
|---|---|---|---|---|---|---|
| 6,049,222 A | 4/2000 | Lawman | | 6,321,298 B1 | 11/2001 | Hubis |
| 6,049,866 A | 4/2000 | Earl | | 6,321,366 B1 | 11/2001 | Tseng et al. |
| 6,052,773 A | 4/2000 | DeHon et al. | | 6,321,373 B1 | 11/2001 | Ekanadham et al. |
| 6,054,873 A | 4/2000 | Laramie | | 6,338,106 B1 | 1/2002 | Vorbach et al. |
| 6,055,619 A | 4/2000 | North et al. | | 6,339,840 B1 | 1/2002 | Kothari et al. |
| 6,058,469 A | 5/2000 | Baxter | | 6,341,318 B1 | 1/2002 | Dakhil |
| 6,076,157 A | 6/2000 | Borkenhagen et al. | | 6,347,346 B1 | 2/2002 | Taylor |
| 6,077,315 A | 6/2000 | Greenbaum et al. | | 6,349,346 B1 | 2/2002 | Hanrahan et al. |
| 6,078,736 A | 6/2000 | Guccione | | 6,353,841 B1 | 3/2002 | Marshall et al. |
| 6,081,903 A | 6/2000 | Vorbach et al. | | 6,362,650 B1 | 3/2002 | New et al. |
| 6,084,429 A | 7/2000 | Trimberger | | 6,370,596 B1 | 4/2002 | Dakhil |
| 6,085,317 A | 7/2000 | Smith | | 6,373,779 B1 | 4/2002 | Pang et al. |
| 6,086,628 A | 7/2000 | Dave et al. | | 6,374,286 B1 | 4/2002 | Gee |
| 6,088,795 A | 7/2000 | Vorbach et al. | | 6,378,068 B1 | 4/2002 | Foster et al. |
| 6,092,174 A | 7/2000 | Roussakov | | 6,381,624 B1 | 4/2002 | Colon-Bonet et al. |
| 6,096,091 A | 8/2000 | Hartmann | | 6,389,379 B1 | 5/2002 | Lin et al. |
| 6,105,105 A | 8/2000 | Trimberger et al. | | 6,389,579 B1 | 5/2002 | Phillips et al. |
| 6,105,106 A | 8/2000 | Manning | | 6,392,912 B1 | 5/2002 | Hanrahan et al. |
| 6,108,760 A | 8/2000 | Mirsky et al. | | 6,398,383 B1 | 6/2002 | Huang |
| 6,118,724 A | 9/2000 | Higginbottom | | 6,400,601 B1 | 6/2002 | Sudo et al. |
| 6,119,181 A | 9/2000 | Vorbach et al. | | 6,404,224 B1 | 6/2002 | Azegami et al. |
| 6,122,719 A | 9/2000 | Mirsky et al. | | 6,405,185 B1 | 6/2002 | Pechanek et al. |
| 6,125,072 A | 9/2000 | Wu | | 6,405,299 B1 | 6/2002 | Vorbach et al. |
| 6,125,408 A | 9/2000 | McGee et al. | | 6,421,808 B1 | 7/2002 | McGeer |
| 6,127,908 A | 10/2000 | Bozler et al. | | 6,421,809 B1 | 7/2002 | Wuytack et al. |
| 6,128,720 A | 10/2000 | Pechanek et al. | | 6,421,817 B1 | 7/2002 | Mohan et al. |
| 6,134,166 A | 10/2000 | Lytle et al. | | 6,425,054 B1 | 7/2002 | Nguyen |
| 6,137,307 A | 10/2000 | Iwanczuk et al. | | 6,425,068 B1 | 7/2002 | Vorbach |
| 6,145,072 A | 11/2000 | Shams et al. | | 6,426,649 B1 | 7/2002 | Fu et al. |
| 6,150,837 A | 11/2000 | Beal et al. | | 6,427,156 B1 | 7/2002 | Chapman et al. |
| 6,150,839 A | 11/2000 | New et al. | | 6,430,309 B1 | 8/2002 | Pressman et al. |
| 6,154,048 A | 11/2000 | Iwanczuk et al. | | 6,434,642 B1 | 8/2002 | Camilleri et al. |
| 6,154,049 A | 11/2000 | New | | 6,434,672 B1 | 8/2002 | Gaither |
| 6,154,826 A | 11/2000 | Wulf et al. | | 6,434,695 B1 | 8/2002 | Esfahani et al. |
| 6,157,214 A | 12/2000 | Marshall | | 6,434,699 B1 | 8/2002 | Jones et al. |
| 6,170,051 B1 | 1/2001 | Dowling | | 6,437,441 B1 | 8/2002 | Yamamoto |
| 6,172,520 B1 | 1/2001 | Lawman et al. | | 6,438,747 B1 | 8/2002 | Schreiber et al. |
| 6,173,419 B1 | 1/2001 | Barnett | | 6,449,283 B1 | 9/2002 | Chao et al. |
| 6,173,434 B1 | 1/2001 | Wirthlin et al. | | 6,456,628 B1 | 9/2002 | Greim et al. |
| 6,178,494 B1 | 1/2001 | Casselman | | 6,457,116 B1 | 9/2002 | Mirsky et al. |
| 6,185,256 B1 | 2/2001 | Saito et al. | | 6,476,634 B1 | 11/2002 | Bilski |
| 6,185,731 B1 | 2/2001 | Maeda et al. | | 6,477,643 B1 | 11/2002 | Vorbach et al. |
| 6,188,240 B1 | 2/2001 | Nakaya | | 6,480,937 B1 | 11/2002 | Vorbach et al. |
| 6,188,650 B1 | 2/2001 | Hamada et al. | | 6,480,954 B2 | 11/2002 | Trimberger et al. |
| 6,198,304 B1 | 3/2001 | Sasaki | | 6,483,343 B1 | 11/2002 | Faith et al. |
| 6,201,406 B1 | 3/2001 | Iwanczuk et al. | | 6,487,709 B1 | 11/2002 | Keller et al. |
| 6,202,182 B1 | 3/2001 | Abramovici et al. | | 6,490,695 B1 | 12/2002 | Zagorski et al. |
| 6,204,687 B1 | 3/2001 | Schultz et al. | | 6,496,740 B1 | 12/2002 | Robertson et al. |
| 6,211,697 B1 | 4/2001 | Lien et al. | | 6,496,902 B1 | 12/2002 | Faanes et al. |
| 6,212,544 B1 | 4/2001 | Borkenhagen et al. | | 6,496,971 B1 | 12/2002 | Lesea et al. |
| 6,212,650 B1 | 4/2001 | Guccione | | 6,504,398 B1 | 1/2003 | Lien et al. |
| 6,215,326 B1 | 4/2001 | Jefferson et al. | | 6,507,898 B1 | 1/2003 | Gibson et al. |
| 6,216,223 B1 | 4/2001 | Revilla et al. | | 6,507,947 B1 | 1/2003 | Schreiber et al. |
| 6,219,833 B1 | 4/2001 | Solomon et al. | | 6,512,804 B1 | 1/2003 | Johnson et al. |
| RE37,195 E | 5/2001 | Kean | | 6,513,077 B2 | 1/2003 | Vorbach et al. |
| 6,230,307 B1 | 5/2001 | Davis et al. | | 6,516,382 B2 | 2/2003 | Manning |
| 6,240,502 B1 | 5/2001 | Panwar et al. | | 6,518,787 B1 | 2/2003 | Allegrucci et al. |
| 6,243,808 B1 | 6/2001 | Wang | | 6,519,674 B1 | 2/2003 | Lam et al. |
| 6,247,147 B1 | 6/2001 | Beenstra et al. | | 6,523,107 B1 | 2/2003 | Stansfield et al. |
| 6,252,792 B1 | 6/2001 | Marshall et al. | | 6,525,678 B1 | 2/2003 | Veenstra et al. |
| 6,256,724 B1 | 7/2001 | Hocevar et al. | | 6,526,520 B1 | 2/2003 | Vorbach et al. |
| 6,260,114 B1 | 7/2001 | Schug | | 6,538,468 B1 | 3/2003 | Moore |
| 6,260,179 B1 | 7/2001 | Ohsawa et al. | | 6,538,470 B1 | 3/2003 | Langhammer et al. |
| 6,262,908 B1 | 7/2001 | Marshall et al. | | 6,539,415 B1 | 3/2003 | Mercs |
| 6,263,430 B1 | 7/2001 | Trimberger et al. | | 6,539,438 B1 | 3/2003 | Ledzius et al. |
| 6,266,760 B1 | 7/2001 | DeHon et al. | | 6,539,477 B1 | 3/2003 | Seawright |
| 6,279,077 B1 | 8/2001 | Nasserbakht et al. | | 6,542,394 B1 | 4/2003 | Marshall et al. |
| 6,282,627 B1 | 8/2001 | Wong et al. | | 6,542,844 B1 | 4/2003 | Hanna |
| 6,282,701 B1 | 8/2001 | Wygodny et al. | | 6,542,998 B1 | 4/2003 | Vorbach |
| 6,285,624 B1 | 9/2001 | Chen | | 6,553,395 B2 | 4/2003 | Marshall et al. |
| 6,286,134 B1 | 9/2001 | Click, Jr. et al. | | 6,553,479 B2 | 4/2003 | Mirsky et al. |
| 6,288,566 B1 | 9/2001 | Hanrahan et al. | | 6,567,834 B1 | 5/2003 | Marshall et al. |
| 6,289,440 B1 | 9/2001 | Casselman | | 6,571,381 B1 | 5/2003 | Vorbach et al. |
| 6,298,043 B1 | 10/2001 | Mauger et al. | | 6,587,939 B1 | 7/2003 | Takano |
| 6,298,396 B1 | 10/2001 | Loyer et al. | | 6,598,128 B1 | 7/2003 | Yoshioka et al. |
| 6,298,472 B1 | 10/2001 | Phillips et al. | | 6,606,704 B1 | 8/2003 | Adiletta et al. |
| 6,301,706 B1 | 10/2001 | Maslennikov et al. | | 6,624,819 B1 | 9/2003 | Lewis |
| 6,311,200 B1 | 10/2001 | Hanrahan et al. | | 6,625,631 B2 | 9/2003 | Ruehle |
| 6,311,265 B1 | 10/2001 | Beckerle et al. | | 6,631,487 B1 | 10/2003 | Abramovici et al. |

| | | |
|---|---|---|
| 6,633,181 B1 | 10/2003 | Rupp |
| 6,657,457 B1 | 12/2003 | Hanrahan et al. |
| 6,658,564 B1 | 12/2003 | Smith et al. |
| 6,665,758 B1 | 12/2003 | Frazier et al. |
| 6,668,237 B1 | 12/2003 | Guccione et al. |
| 6,681,388 B1 | 1/2004 | Sato et al. |
| 6,687,788 B2 | 2/2004 | Vorbach et al. |
| 6,697,979 B1 | 2/2004 | Vorbach et al. |
| 6,704,816 B1 | 3/2004 | Burke |
| 6,708,325 B2 | 3/2004 | Cooke et al. |
| 6,717,436 B2 | 4/2004 | Kress et al. |
| 6,721,830 B2 | 4/2004 | Vorbach et al. |
| 6,725,334 B2 | 4/2004 | Barroso et al. |
| 6,728,871 B1 | 4/2004 | Vorbach et al. |
| 6,745,317 B1 | 6/2004 | Mirsky et al. |
| 6,748,440 B1 | 6/2004 | Lisitsa et al. |
| 6,751,722 B2 | 6/2004 | Mirsky et al. |
| 6,754,805 B1 | 6/2004 | Juan |
| 6,757,847 B1 | 6/2004 | Farkash et al. |
| 6,757,892 B1 | 6/2004 | Gokhale et al. |
| 6,782,445 B1 | 8/2004 | Olgiati et al. |
| 6,785,826 B1 | 8/2004 | Durham et al. |
| 6,802,206 B2 | 10/2004 | Kurecka et al. |
| 6,803,787 B1 | 10/2004 | Wicker, Jr. |
| 6,820,188 B2 | 11/2004 | Stansfield et al. |
| 6,829,697 B1 | 12/2004 | Davis et al. |
| 6,836,842 B1 | 12/2004 | Guccione et al. |
| 6,847,370 B2 | 1/2005 | Baldwin et al. |
| 6,859,869 B1 | 2/2005 | Vorbach |
| 6,868,476 B2 | 3/2005 | Rosenbluth et al. |
| 6,871,341 B1 | 3/2005 | Shyr |
| 6,874,108 B1 | 3/2005 | Abramovici et al. |
| 6,886,092 B1 | 4/2005 | Douglass et al. |
| 6,901,502 B2 | 5/2005 | Yano et al. |
| 6,928,523 B2 | 8/2005 | Yamada |
| 6,957,306 B2 | 10/2005 | So et al. |
| 6,961,924 B2 | 11/2005 | Bates et al. |
| 6,975,138 B2 | 12/2005 | Pani et al. |
| 6,977,649 B1 | 12/2005 | Baldwin et al. |
| 7,000,161 B1 | 2/2006 | Allen et al. |
| 7,007,096 B1 | 2/2006 | Lisitsa et al. |
| 7,010,687 B2 | 3/2006 | Ichimura |
| 7,028,107 B2 | 4/2006 | Vorbach et al. |
| 7,036,114 B2 | 4/2006 | McWilliams et al. |
| 7,038,952 B1 | 5/2006 | Zack et al. |
| 7,043,416 B1 | 5/2006 | Lin |
| 7,144,152 B2 | 12/2006 | Rusu et al. |
| 7,210,129 B2 | 4/2007 | May et al. |
| 7,216,204 B2 | 5/2007 | Rosenbluth et al. |
| 7,237,087 B2 | 6/2007 | Vorbach et al. |
| 7,249,351 B1 | 7/2007 | Songer et al. |
| 7,254,649 B2 | 8/2007 | Subramanian et al. |
| 7,340,596 B1 | 3/2008 | Crosland et al. |
| 7,346,644 B1 | 3/2008 | Langhammer et al. |
| 7,350,178 B1 | 3/2008 | Crosland et al. |
| 7,382,156 B2 | 6/2008 | Pani et al. |
| 7,455,450 B2 | 11/2008 | Liu et al. |
| 7,595,659 B2 | 9/2009 | Vorbach et al. |
| 7,650,448 B2 | 1/2010 | Vorbach et al. |
| 7,657,877 B2 | 2/2010 | Vorbach et al. |
| 7,759,968 B1 | 7/2010 | Hussein et al. |
| 7,873,811 B1 | 1/2011 | Wolinski et al. |
| 2001/0001860 A1 | 5/2001 | Bieu |
| 2001/0003834 A1 | 6/2001 | Shimonishi |
| 2001/0010074 A1 | 7/2001 | Nishihara et al. |
| 2001/0018733 A1 | 8/2001 | Fujii et al. |
| 2001/0032305 A1 | 10/2001 | Barry |
| 2002/0010853 A1 | 1/2002 | Trimberger et al. |
| 2002/0013861 A1 | 1/2002 | Adiletta et al. |
| 2002/0038414 A1 | 3/2002 | Taylor |
| 2002/0045952 A1 | 4/2002 | Blemel |
| 2002/0051482 A1 | 5/2002 | Lomp |
| 2002/0073282 A1 | 6/2002 | Chauvel et al. |
| 2002/0083308 A1 | 6/2002 | Pereira et al. |
| 2002/0099759 A1 | 7/2002 | Gootherts |
| 2002/0103839 A1 | 8/2002 | Ozawa |
| 2002/0124238 A1 | 9/2002 | Metzgen |
| 2002/0138716 A1 | 9/2002 | Master et al. |
| 2002/0143505 A1 | 10/2002 | Drusinsky |
| 2002/0144229 A1 | 10/2002 | Hanrahan |
| 2002/0147932 A1 | 10/2002 | Brock et al. |
| 2002/0152060 A1 | 10/2002 | Tseng |
| 2002/0156962 A1 | 10/2002 | Chopra et al. |
| 2002/0165886 A1 | 11/2002 | Lam |
| 2003/0001615 A1 | 1/2003 | Sueyoshi et al. |
| 2003/0014743 A1 | 1/2003 | Cooke et al. |
| 2003/0046607 A1 | 3/2003 | May et al. |
| 2003/0052711 A1 | 3/2003 | Taylor |
| 2003/0055861 A1 | 3/2003 | Lai et al. |
| 2003/0056062 A1 | 3/2003 | Prabhu |
| 2003/0056085 A1 | 3/2003 | Vorbach |
| 2003/0056091 A1 | 3/2003 | Greenberg |
| 2003/0056202 A1 | 3/2003 | May et al. |
| 2003/0061542 A1 | 3/2003 | Bates et al. |
| 2003/0062922 A1 | 4/2003 | Douglass et al. |
| 2003/0070059 A1 | 4/2003 | Dally et al. |
| 2003/0086300 A1 | 5/2003 | Noyes et al. |
| 2003/0093662 A1 | 5/2003 | Vorbach et al. |
| 2003/0097513 A1 | 5/2003 | Vorbach et al. |
| 2003/0123579 A1 | 7/2003 | Safavi et al. |
| 2003/0135686 A1 | 7/2003 | Vorbach et al. |
| 2003/0154349 A1 | 8/2003 | Berg et al. |
| 2003/0192032 A1 | 10/2003 | Andrade et al. |
| 2004/0015899 A1 | 1/2004 | May et al. |
| 2004/0025005 A1 | 2/2004 | Vorbach et al. |
| 2004/0039880 A1 | 2/2004 | Pentkovski et al. |
| 2004/0078548 A1 | 4/2004 | Claydon et al. |
| 2004/0168099 A1 | 8/2004 | Vorbach et al. |
| 2004/0199688 A1 | 10/2004 | Vorbach et al. |
| 2005/0066213 A1 | 3/2005 | Vorbach et al. |
| 2005/0091468 A1 | 4/2005 | Morita et al. |
| 2005/0144210 A1 | 6/2005 | Simkins et al. |
| 2005/0144212 A1 | 6/2005 | Simkins et al. |
| 2005/0144215 A1 | 6/2005 | Simkins et al. |
| 2006/0036988 A1* | 2/2006 | Allen et al. ............ 716/17 |
| 2006/0230094 A1 | 10/2006 | Simkins et al. |
| 2006/0230096 A1 | 10/2006 | Thendean et al. |
| 2007/0050603 A1 | 3/2007 | Vorbach et al. |
| 2007/0083730 A1 | 4/2007 | Vorbach et al. |
| 2008/0313383 A1 | 12/2008 | Morita et al. |
| 2009/0085603 A1 | 4/2009 | Paul et al. |
| 2009/0193384 A1 | 7/2009 | Sima et al. |
| 2010/0306602 A1 | 12/2010 | Kamiya et al. |

FOREIGN PATENT DOCUMENTS

| | | |
|---|---|---|
| DE | 44 16 881 | 11/1994 |
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 22 776 | 3/1999 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 208 457 | 1/1987 |
| EP | 0 221 360 | 5/1987 |
| EP | 0 398 552 | 11/1990 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 638 867 A2 | 8/1994 |
| EP | 0 628 917 | 12/1994 |
| EP | 0 678 985 | 10/1995 |
| EP | 0 686 915 | 12/1995 |
| EP | 0 707 269 | 4/1996 |
| EP | 0 726 532 | 8/1996 |
| EP | 0 735 685 | 10/1996 |

| | | |
|---|---|---|
| EP | 0 746 106 | 12/1996 |
| EP | 0 748 051 | 12/1996 |
| EP | 0 926 594 | 6/1999 |
| EP | 1 061 439 | 12/2000 |
| EP | 1 102 674 | 5/2001 |
| EP | 1 115 204 | 7/2001 |
| EP | 1 146 432 | 10/2001 |
| EP | 0 696 001 | 12/2001 |
| EP | 1 669 885 | 6/2006 |
| FR | 2 752 466 | 2/1998 |
| GB | 2 304 438 | 3/1997 |
| JP | 58-58672 | 4/1983 |
| JP | 10-44571 | 2/1989 |
| JP | 1-229378 | 9/1989 |
| JP | 2-130023 | 5/1990 |
| JP | 2-226423 | 9/1990 |
| JP | 5-265705 | 10/1993 |
| JP | 5-276007 | 10/1993 |
| JP | 6-266605 | 9/1994 |
| JP | 7-086921 | 3/1995 |
| JP | 7-154242 | 6/1995 |
| JP | 8-148989 | 6/1995 |
| JP | 7-182160 | 7/1995 |
| JP | 7-182167 | 7/1995 |
| JP | 8-44581 | 2/1996 |
| JP | 08069447 | 3/1996 |
| JP | 8-101761 | 4/1996 |
| JP | 8-102492 | 4/1996 |
| JP | 8-106443 | 4/1996 |
| JP | 8-221164 | 8/1996 |
| JP | 8-250685 | 9/1996 |
| JP | 9-27745 | 1/1997 |
| JP | 9-237284 | 9/1997 |
| JP | 9-294069 | 11/1997 |
| JP | 11-046187 | 2/1999 |
| JP | 11-184718 | 7/1999 |
| JP | 11-307725 | 11/1999 |
| JP | 2000-076066 | 3/2000 |
| JP | 2000-181566 | 6/2000 |
| JP | 2000-201066 | 7/2000 |
| JP | 2000-311156 | 11/2000 |
| JP | 2001-500682 | 1/2001 |
| JP | 2001-167066 | 6/2001 |
| JP | 2001-510650 | 7/2001 |
| JP | 2001-236221 | 8/2001 |
| JP | 2002-0033457 | 1/2002 |
| JP | 05-509184 | 12/2003 |
| JP | 3-961028 | 8/2007 |
| WO | WO90/04835 | 5/1990 |
| WO | WO90/11648 | 10/1990 |
| WO | WO92/01987 | 2/1992 |
| WO | WO93/11503 | 6/1993 |
| WO | WO94/06077 | 3/1994 |
| WO | WO94/08399 | 4/1994 |
| WO | WO95/26001 | 9/1995 |
| WO | WO98/10517 | 3/1998 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35294 | 8/1998 |
| WO | WO98/35299 | 8/1998 |
| WO | WO99/00731 | 1/1999 |
| WO | WO99/00739 | 1/1999 |
| WO | WO99/12111 | 3/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | 00/45282 | 8/2000 |
| WO | WO00/49496 | 8/2000 |
| WO | WO00/77652 | 12/2000 |
| WO | WO01/55917 | 8/2001 |
| WO | WO02/13000 | 2/2002 |
| WO | WO02/29600 | 4/2002 |
| WO | WO02/50665 | 6/2002 |
| WO | WO02/071196 | 9/2002 |
| WO | WO02/071248 | 9/2002 |
| WO | WO02/071249 | 9/2002 |
| WO | WO02/103532 | 12/2002 |
| WO | WO03/017095 | 2/2003 |
| WO | WO03/023616 | 3/2003 |
| WO | WO03/025781 | 3/2003 |
| WO | WO03/036507 | 5/2003 |
| WO | WO 03/091875 | 11/2003 |
| WO | WO2004/053718 | 6/2004 |
| WO | WO2004/114128 | 12/2004 |
| WO | WO2005/045692 | 5/2005 |
| WO | WO 2007/030395 | 3/2007 |

OTHER PUBLICATIONS

Abnous et al., "Ultra-Low-Power Domain-Specific Multimedia Processors," U.C. Berkeley, 1996 IEEE, pp. 461-470.

Abnous, A., et al., "The Pleiades Architecture," Chapter 1 of *The Application of Programmable DSPs in Mobile Communications*, A. Gatherer and A. Auslander, Ed., Wiley, 2002, pp. 1-33.

Ade, et al., "Minimum Memory Buffers in DSP Applications," Electronics Letters, vol. 30, No. 6, Mar. 17, 1994, pp. 469-471.

Albaharna, O.T. et al., "On the Viability of FPGA-Based Integrated Coprocessors," Dept. of Electrical and Electronic Engineering, Imperial College of Science, London, 1999 IEEE, pp. 206-215.

Alippi, et al., "Determining the Optimum Extended Instruction Set Architecture for Application Specific Reconfigurable VLIW CPUs," IEEE, 2001, pp. 50-56.

Altera, "Flex 8000 Programmable Logic Device Family," Altera Corporation product description, Jan. 2003, pp. 1-62.

Altera, "Flex 10K Embedded Programmable Logic Device Family," Altera Corporation product description, Jan. 2003, pp. 1-128.

Arabi, et al., "PLD Integrates Dedicated High-speed Data Buffering, Complex State machine, and Fast Decode Array," conference record on WESCON '93, Sep. 28, 1993, pp. 432-436.

Athanas, "A Functional Reconfigurable Architecture and Compiler for Adoptive Computing," IEEE 1993, pp. 49-55.

Athanas, et al., "An Adaptive Hardware Machine Architecture and Compiler for Dynamic Processor Reconfigutation," IEEE, Laboratory for Engineering man/Machine Systems Division of Engineering, Box D, Brown University, Providence, Rhode Island, 1991, pp. 397-400.

Athanas et al., "Processor Reconfiguration Through Instruction-Set Metamorphosis," 1993, IEEE Computers, pp. 11-18.

Bakkes, P.J., et al., "Mixing Fixed and Reconfigurable Logic for Array Processing," Dept. of Electrical and Electronic Engineering, University of Stellenbosch, South Africa, 1996 IEEE, pp. 118-125.

Baumgarte, V. et al., PACT XPP "A Self-reconfigurable Data Processing Architecture," PACT Info. GMBH, Munchen Germany, 2001, 7 pages.

Beck et al., "From control flow to data flow," TR 89-1050, Oct. 1989, Dept. of Computer Science, Cornell University, Ithaca, NY, pp. 1-25.

Becker et al., "Automatic Parallelism Exploitation for FPL-Based Accelerators." 1998, Proc. 31$^{st}$ Annual Hawaii International Conference on System Sciences, pp. 169-178.

Becker, J. et al., "Parallelization in Co-compilation for Configurable Accelerators—a Host/accelerator Partitioning Compilation Method," Poceedings of Asia and South Pacific Design Automation Conference, Yokohama, Japan, Feb. 10-13, 1998, 11 pages.

Bittner, "Wormhole Run-time Reconfiguration: Conceptualization and VLSI Design of a High Performance Computing System," *Dissertation*, Jan. 23, 1997, pp. I-XX, 1-415.

Bratt, A, "Motorola field programmable analogue arrays, present hardware and future trends," Motorola Programmable Technology Centre, Gadbrook Business Centre, Northwich, Cheshire, 1998, The Institute of Electrical Engineers, IEE. Savoy Place, London, pp. 1-5.

Cadambi, et al., "Managing Pipeline-reconfigurable FPGAs," ACM, 1998, pp. 55-64.

Callahan, et al., "The Garp Architecture and C Compiler," Computer, Apr. 2000, pp. 62-69.

Cardoso, J.M.P. et al., "A novel algorithm combining temporal partitioning and sharing of functional units," University of Algarve, Faro, Portugal, 2001 IEEE, pp. 1-10.

Cardoso, Joao M.P. and Markus Weinhardt, "XPP-VC: A C Compiler with Temporal Partitioning for the PACT-XPP Architecture," Field-Programmable Logic and Applications. Reconfigurable Computing is Going Mainstream, 12$^{th}$ International Conference FPL 2002, Proceedings (Lecture Notes in Computer Science, vol. 2438) Springer-Verlag Berlin, Germany, 2002, pp. 864-874.

Cardoso, J.M.P. "Compilation of Java™ Algorithms onto Reconfigurable Computing Systems with Exploitation of Operation-Level Parallelism," Ph.D. Thesis, Universidade Tecnica de Lisboa (UTL), Lisbon, Portugal Oct. 2000 (Table of Contents and *English Abstract only*).

Chen et al., "A reconfigurable multiprocessor IC for rapid prototyping of algorithmic-specific high-speed DSP data paths," IEEE Journal of Solid-State Circuits, vol. 27, No. 12, Dec. 1992, pp. 1895-1904.

Compton, K. et al., "Configurable Computing: A Survey of Systems and Software," Northwestern University, Dept. of ECE, Technical Report, 1999, (XP-002315148), 39 pages.

DeHon, A., "DPGA Utilization and Application," MIT Artificial Intelligence Laboratory, Proceedings of the Fourth International ACM Symposium on Field-Programmable Gate Arrays (FPGA '96), IEEE Computer Society, pp. 1-7.

Diniz, P., et al., "Automatic Synthesis of Data Storage and Control Structures for FPGA-based Computing Engines," 2000, IEEE, pp. 91-100.

Diniz, P., et al., "A behavioral synthesis estimation interface for configurable computing," University of Southern California, Marina Del Rey, CA, 2001 IEEE, pp. 1-2.

Donandt, "Improving Response Time of Programmable Logic Controllers by use of a Boolean Coprocessor," AEG Research Institute Berlin, IEEE, 1989, pp. 4-167-4-169.

Dutt, et al., "If Software is King for Systems-in-Silicon, What's New in Compilers?," IEEE, 1997, pp. 322-325.

Ferrante, J. et al., "The Program Dependence Graph and its Use in Optimization ACM Transactions on Programming Languages and Systems," Jul. 1987, USA, [online] Bd. 9, Nr., 3, pp. 319-349, XP002156651 ISSN: 0164-0935 ACM Digital Library.

Fineberg, S, et al., "Experimental Analysis of a Mixed-Mode Parallel Architecture Using Bitonic Sequence Sorting," Journal of Parallel and Distributed Computing, vol. 11, No. 3, Mar. 1991, pp. 239-251.

Fomaciari, et al., System-level power evaluation metrics, 1997 Proceedings of the 2$^{nd}$ Annual IEEE International Conference on Innovative Systems in Silicon, New York, NY, Oct. 1997, pp. 323-330.

Forstner, "Wer Zuerst Kommt, Mahlt Zuerst!: Teil 3: Einsatzgebiete und Anwendungbeispiele von FIFO-Speichern," Elektronik, Aug. 2000, pp. 104-109.

Franklin, Manoj et al., "A Fill-Unit Approach to Multiple Instruction Issue," Proceedings of the Annual International Symposium on Microarchitecture, Nov. 1994, pp. 162-171.

Gokhale, M.B.et al., "Automatic Allocation of Arrays to Memories in FPGA processors with Multiple Memory Banks," Field-Programmable Custom Computing Machines, 1999, IEEE, 6 pages.

Hammes, Jeff et al., "Cameron: High Level Language Compilation for Reconfigurable Systems," Department of Computer Science, Colorado State University, Conference on Parallel Architectures and Compilation Techniques, Oct. 12-16, 1999, 9 pages.

Hartenstein, R., "Coarse grain reconfigurable architectures," Design Automation Conference, 2001, Proceedings of the ASP-DAC 2001 Asia and South Pacific, Jan. 30-Feb. 2, 2001, IEEE Jan. 30, 2001, pp. 564-569.

Hastie et al., "The implementation of hardware subroutines on field programmable gate arrays," Custom Integrated Circuits Conference, 1990, Proceedings of the IEEE 1990, May 16, 1990, pp. 31.3.1-31.4.3 (3 pages).

Hauck, "The Roles of FPGAs in Reprogrammable Systems," IEEE, Apr. 1998, pp. 615-638.

Hauser, J.R., et al., "Garp: A MIPS Processor with a Reconfigurable Coprocessor," University of California, Berkeley, IEEE, 1997, pp. 24-33.

Hedge, S.J., "3D WASP Devices for On-line Signal and Data Processing," 1994, International Conference on Wafer Scale Integration, pp. 11-21.

Hwang, K., "Advanced Computer Architecture—Parallelism, Scalability, Programmability," 1993, McGraw-Hill, Inc., pp. 348-355.

Hwang, L. et al., "Min-cut Replication in Partitioned Networks," IEEE Transactions on Computer-Aided Design of Integrated Circuits and Systems, [online] Bd. 14, Nr. 1, Jan. 1995, pp. 96-106, XP00053228 USA ISSN: 0278-0070 IEEE Xplore.

IBM Technical Disclosure Bulletin, IBM Corp., New York, XP000424878, Bd. 36, Nr. 11, Nov. 1, 1993, pp. 335-336.

Iseli, C.,et al. "A C++ Compiler for FPGA Custom Execution Units Synthesis," IEEE, 1995, pp. 173-179.

Isshiki, Tsuyoshi, et al., "Bit-Serial Pipeline Synthesis for Multi-FPGA Systems with C++ Design Capture," 1996 IEEE, pp. 38-47.

Jacob, J., et al., "Memory Interfacing and Instruction Specification for Reconfigurable Processors," ACM 1999, pp. 145-154.

Jantsch, Axel et al., "A Case Study on Hardware/Software Partitioning," Royal Institute of Technology, Kista, Sweden, Apr. 10, 1994, IEEE, pp. 111-118.

John, L., et al., "A Dynamically Reconfigurable Interconnect for Array Processors," vol. 6, No. 1, Mar. 1998, IEEE, pp. 150-157.

Kastrup, B., "Automatic Hardware Synthesis for a Hybrid Reconfigurable CPU Featuring Philips CPLDs," Proceedings of the PACT Workshop on Reconfigurable Computing, 1998, pp. 5-10.

Kaul, M., et al., "An automated temporal partitioning and loop fission approach of FPGA based reconfigurable synthesis of DSP applications," University of Cincinnati, Cincinnati, OH, ACM 1999, pp. 616-622.

Knittel, Gunter, "A PCI-compatible FPGA-Coprocessor for 2D/3D Image Processing," University of Turgingen, Germany, 1996 IEEE, pp. 136-145.

Koch, A., et al., "Practical Experiences with the SPARXIL Co-Processor," 1998, IEEE, pp. 394-398.

Koren et al., "A data-driven VLSI array for arbitrary algorithms," IEEE Computer Society, Long Beach, CA vol. 21, No. 10, Oct. 1, 1988, pp. 30-34.

Kung, "Deadlock Avoidance for Systolic Communication," 1988 Conference Proceedings of the 15$^{th}$ Annual International Symposium on Computer Architecture, May 30, 1998, pp. 252-260.

Lee et al., "A new distribution network based on controlled switching elements and its applications," IEEE/ACT Trans. of Networking, vol. 3, No. 1, pp. 70-81, Feb. 1995.

Lee, Jong-eun et al., "Reconfigurable ALU Array Architecture with Conditional Execution," International Soc. Design Conference (ISOOC) [online] Oct. 25, 2004, Seoul, Korea, 5 pages.

Ling, X., "WASMII: An MPLD with Data-Driven Control on a Virtual Hardware," Journal of Supercomputing, Kluwer Acdemic Publishers, Dordrecht, Netherlands, 1995, pp. 253-276.

Ling et al., "WASMII: A Multifunction Programmable Logic Device (MPLD) with Data Driven Control," The Transactions of the Institute of Electronics, Information and Communication Engineers, Apr. 25, 1994, vol. 177-D-1, Nr. 4, pp. 309-317. [This reference is in Chinese, but should be comparable in content to the Ling et al. reference above].

Mano, M.M., "Digital Design," by Prentice Hall, Inc., Englewood Cliffs, New Jersey 07632, 1984, pp. 119-125, 154-161.

Margolus, N., "An FPGA architecture for DRAM-based systolic computations," Boston University Center for Computational Science and MIT Artificial Intelligence Laboratory, IEEE 1997, pp. 2-11.

Maxfield,C., "Logic that Mutates While-U-Wait," EDN (Bur. Ed) (USA), EDN (European Edition), Nov. 7, 1996, Cahners Publishing, USA, pp. 137-140, 142.

Miller, M.J., et al., "High-Speed FIFOs Contend with Widely Differing Data Rates: Dual-port RAM Buffer and Dual-pointer System Provide Rapid, High-density Data Storage and Reduce Overhead," Computer Design, Sep. 1, 1985, pp. 83-86.

Mirsky, E. DeHon, "MATRIX: A Reconfigurable Computing Architecture with Configurable Instruction Distribution and Deployable Resources," Proceedings of the IEEE Symposium on FPGAs for Custom Computing Machines, 1996, pp. 157-166.

Myers, G. "Advances in Computer Architecture," Wiley-Interscience Publication, 2nd ed., John Wiley & Sons, Inc., 1978, pp. 463-494.

Nilsson, et al., "The Scalable Tree Protocol—A Cache Coherence Approaches for Large-Scale Multiprocessors," IEEE, pp. 498-506, Dec. 1992.

Norman, R.S., "Hyperchip Business Summary, The Opportunity," Jan. 31, 2000, pp. 1-3.

Ozawa, Motokazu et al., "A Cascade ALU Architecture for Asynchronous Super-Scalar Processors," IEICE Transactions on Electronics, Electronics Society, Tokyo, Japan, vol. E84-C, No. 2, Feb. 2001, pp. 229-237.
Piotrowski, A., "IEC-BUS, Die Funktionsweise des IEC-Bus unde seine Anwendung in Geräten and Systemen," 1987, Franzis-Verlag GmbH, München, pp. 20-25.
Quenot, G.M., et al., "A Reconfigurable Compute Engine for Real-Time Vision Automata Prototyping," Laboratoire Systeme de Perception, DGA/Etablissement Technique Central de l'Armement, France, 1994 IEEE, pp. 91-100.
Razdan et al., A High-Performance Microarchitecture with Hardware-Programmable Functional Units, Micro-27, Proceedings of the 27th Annual International Symposium on Microarchitecture, IEEE Computer Society and Association for Computing Machinery, Nov. 30-Dec. 2, 1994, pp. 172-180.
Saleeba, M. "A Self-Contained Dynamically Reconfigurable Processor Architecture," Sixteenth Australian Computer Science Conference, ASCS-16, QLD, Australia, Feb. 1993, pp. 59-70.
Schmidt, H. et al., "Behavioral synthesis for FGPA-based computing," Carnegie Mellon University, Pittsburgh, PA, 1994 IEEE, pp. 125-132.
Schmit, et al., "Hidden Markov Modeling and Fuzzy Controllers in FPGAs, FPGAs for Custom Computing Machines," 1995; Proceedings, IEEE Symposium in Napa Valley, CA, Apr. 1995, pp. 214-221.
Shirazi, et al., "Quantitative analysis of floating point arithmetic on FPGA based custom computing machines," IEEE Symposium on FPGAs for Custom Computing Machines, IEEE Computer Society Press, Apr. 19-21, 1995, pp. 155-162.
Siemers, C.,"Rechenfabrik Ansaetze Fuer Extrem Parallele Prozessoren," Verlag Heinze Heise GmbH., Hannover, DE No. 15, Jul. 16, 2001, pp. 170-179.
Siemers et al., "The .>S<puter: A Novel Micoarchitecture Model for Execution inside Superscalar and VLIW Processors Using Reconfigurable Hardware," Australian Computer Science Communications, vol. 20, No. 4, Computer Architecture, Proceedings of the 3rd Australian Computer Architecture Conference, Perth, John Morris, Ed., Feb. 2-3, 1998, pp. 169-178.
Simunic, et al., Source Code Optimization and Profiling of Energy Consumption in Embedded Systems, Proceedings of the 13th International Symposium on System Synthesis, Sep. 2000, pp. 193-198.
Skokan, Z.E., "Programmable logic machine (A programmable cell array)," IEEE Journal of Solid-State Circuits, vol. 18, Issue 5, Oct. 1983, pp. 572-578.
Sueyoshi, T, "Present Status and Problems of the Reconfigurable Computing Systems Toward the Computer Evolution," Department of Artificial Intelligence, Kyushi Institute of Technology, Fukuoka, Japan; Institute of Electronics, Information and Communication Engineers, vol. 96, No. 426, IEICE Technical Report (1996), pp. 111-119 [English Abstract Only].
Sutton et al., "A Multiprocessor DSP System Using PADDI-2," U.C. Berkeley, 1998 ACM, pp. 62-65.
Tau, E., et al., "A First Generation DPGA Implementation," FPD '95, pp. 138-143.
Tenca, A.F., et al., "A Variable Long-Precision Arithmetic Unit Design for Reconfigurable Coprocessor Architectures," University of California, Los Angeles, 1998, pp. 216-225.
The XPP White Paper, Release 2.1, PACT—A Technical Perspective, Mar. 27, 2002, pp. 1-27.
TMS320C54X DSP: CPU and Peripherals, Texas Instruments, 1996, 25 pages.
TMS320C54x DSP: Mnemonic Instruction Set, Texas Instruments, 1996, 342 pages.
Tsutsui, A., et al., "YARDS: FPGA/MPU Hybrid Architecture for Telecommunication Data Processing," NTT Optical Network Systems Laboratories, Japan, 1997 ACM, pp. 93-99.
Villasenor, et al., "Configurable Computing Solutions for Automatic Target Recognition," IEEE, 1996 pp. 70-79.
Villasenor, et al., "Configurable Computing," Scientific American, vol. 276, No. 6, Jun. 1997, pp. 66-71.

Villasenor, et al., "Express Letters Video Communications Using Rapidly Reconfigurable Hardware," IEEE Transactions on Circuits and Systems for Video Technology, IEEE, Inc., NY, Dec. 1995, pp. 565-567.
Wada, et al., "A Performance Evaluation of Tree-based Coherent Distributed Shared Memory," Proceedings of the Pacific RIM Conference on Communications, Comput and Signal Processing, Victoria, May 19-21, 1993, pp. 390-393.
Weinhardt, M., "Compilation Methods for Structure-programmable Computers," dissertation, ISBN 3-89722-011-3, 1997. [Table of Contents and English Abstract Provided].
Weinhardt, Markus et al., "Pipeline Vectorization for Reconfigurable Systems," 1999, IEEE, pp. 52-62.
Weinhardt, Markus et al., "Pipeline Vectorization," IEEE Transactions on Computer-Aided Design of Integrated Circuits and Systems, vol. 20, No. 2, Feb. 2001, pp. 234-248.
Wittig, et al., "OneChip: An FPGA Processor with Reconfigurable Logic," IEEE, 1996, pp. 126-135.
Wu, et al., "A New Cache Directory Scheme," IEEE, pp. 466-472, Jun. 1996.
Xilinx, "Logic Cell Array Families: XC4000, XC4000A and XC4000H," 1994, product description, pp. 2-7, 2-9, 2-14, 2-15, 8-16, and 9-14.
Xilinx, "Spartan and SpartanXL Families Field Programmable Gate Arrays," Jan. 1999, Xilinx, pp. 4-3 through 4-70.
Xilinx, "XC6200 Field Programmable Gate Arrays," Apr. 24, 1997, Xilinx product description, pp. 1-73.
Xilinx, "XC3000 Series Field Programmable Gate Arrays," Nov. 6, 1998, Xilinx product description, pp. 1-76.
Xilinx, "XC4000E and XC4000X Series Field Programmable Gate Arrays," May 14, 1999, Xilinx product description, pp. 1-68.
Xu, H. et al., "Parallel QR Factorization on a Block Data Flow Architecture," Conference Proceeding Article, Mar. 1, 1992, pp. 332-336 XPO10255276, p. 333, Abstract 2.2, 2.3, 2.4—p. 334.
Ye, Z.A. et al., "A C-Compiler for a Processor With a Reconfigurable Functional Unit," FPGA 2000 ACM/SIGNA International Symposium on Field Programmable Gate Arrays, Monterey, CA Feb. 9-11, 2000, pp. 95-100.
Yeung, A. et al., "A data-driven architecture for rapid prototyping of high throughput DSP algorithms," Dept. of Electrical Engineering and Computer Sciences, Univ. of California, Berkeley, USA, Proceedings VLSI Signal Processing Workshop, IEEE Press, pp. 225-234, Napa, Oct. 1992.
Yeung, A. et al., "A reconfigurable data-driven multiprocessor architecture for rapid prototyping of high throughput DSP algorithms," Dept. of Electrical Engineering and Computer Sciences, Univ. of California, Berkeley, USA, pp. 169-178, IEEE 1993.
Zhang, et al., "Architectural Evaluation of Flexible Digital Signal Processing for Wireless Receivers, Signals, Systems and Computers," 2000; Conference Record of the Thirty-Fourth Asilomar Conference, Bd. 1, Oct. 29, 2000, pp. 78-83.
Zhang, et al., "A 1-V Heterogeneous Reconfigurable DSP IC for Wireless Baseband Digital Signal Processing," IEEE Journal of Solid-State Circuits, vol. 35, No. 11, Nov. 2000, pp. 1697-1704.
Zhang et al., "Abstract: Low-Power Heterogeneous Reconfigurable Digital Signal Processors with Energy-Efficient Interconnect Network," U.C. Berkeley (2004), pp. 1-120.
Li, Zhiyuan, et al., "Configuration prefetching techniques for partial reconfigurable coprocessor with relocation and defragmentation," International Symposium on Field Programmable Gate Arrays, Feb. 1, 2002, pp. 187-195.
ARM Limited, "ARM Architecture Reference Manual," Dec. 6, 2000, pp. A10-6-A10-7.
Atmel, 5-K-50K Gates Coprocessor FPGA with Free Ram, Data Sheet, Jul. 2006, 55 pages.
Atmel, FPGA-based FIR Filter Application Note, Sep. 1999, 10 pages.
Atmel, "An Introduction to DSP Applications using the AT40K FPGA," FPGA Application Engineering, San Jose, CA, Apr. 2004, 15 pages.
Atmel, Configurable Logic Design & Application Book, Atmel Corporation, 1995, pp. 2-19 through 2-25.

Atmel, Field Programmable Gate Array Configuration Guide, AT6000 Series Configuration Data Sheet, Sep. 1999, pp. 1-20.

Bacon, D. et al., "Compiler Transformations for High-Performance Computing," ACM Computing Surveys, 26(4):325-420 (1994).

Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003).

Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002).

Clearspeed, CSX Processor Architecture, Whitepaper, PN-1110-0702, 2007, pp. 1-15, www.clearspeed.com.

Clearspeed, CSX Processor Architecture, Whitepaper, PN-1110-0306, 2006, pp. 1-14, www.clearspeed.com.

Cronquist, D. et al., Architecture Design of Reconfigurable Pipelined Datapaths, Department of Computer Science and Engineering, University of Washington, Seattle, WA, Proceedings of the 20*th* Anniversary Conference on Advanced Research in VSLI, 1999, pp. 1-15.

DeHon, Andre, "Reconfigurable Architectures for General-Purpose Computing," Massachusetts Institute of Technology, Technical Report AITR-1586, Oct. 1996, XP002445054, Cambridge, MA, pp. 1-353.

Ebeling, C. et al., "Mapping Applications to the RaPiD Configurable Architecture," Department of Computer Science and Engineering, University of Washington, Seattle, WA, *FPGAs for Custom Computing Machines, 1997. Proceedings., The 5th Annual IEEE Symposium*, Publication Date: Apr. 16-18, 1997, 10 pages.

Equator, Pixels to Packets, Enabling Multi-Format High Definition Video, Equator Technologies BSP-15 Product Brief, www.equator.com, 2001, 4 pages.

Freescale Slide Presentation, an Introduction to Motorola's RCF (Reconfigurable Compute Fabric) Technology, Presented by Frank David, Launched by Freescale Semiconductor, Inc., 2004, 39 pages.

Genius, D. et al., "A Case for Array Merging in Memory Hierarchies," Proceedings of the 9th International Workshop on Compilers for Parallel Computers, CPC'01 (Jun. 2001), 10 pages.

Hartenstein, R. et al., "A new FPGA architecture for word-oriented datapaths," Proc. FPL'94, Springer LNCS, Sep. 1994, pp. 144-155.

Hwang, K., "Computer Architecture and Parallel Processing," Data Flow Computers and VLSI Computations, XP-002418655, 1985 McGraw-Hill, Chapter 10, pp. 732-807.

Inside DSP, "Ambric Discloses Massively Parallel Architecture," Aug. 23, 2006, HTTP://insidedsp.com/tabid/64/articleType/ArticleView/articleId/155/Defa . . . , 2 pages.

Intel, Intel MXP5800/MXP5400 Digital Media Processors, Architecture Overview, Jun. 2004, Revision 2.4, pp. 1-24.

Kean, T.A., "Configurable Logic: A Dynamically Programmable Cellular Architecture and its VLSI Implementation," University of Edinburgh (Dissertation) 1988, pp. 1-286.

Kean, T., et al., "A Fast Constant Coefficient Multiplier for the XC6200," Xilinx, Inc., Lecture Notes in Computer Science, vol. 1142, Proceedings of the 6*th* International Workshop of Field-Programmable Logic, 1996, 7 pages.

Kim et al., "A Reconfigurable Multifunction Computing Cache Architecture," IEEE Transactions on Very Large Scale Integration (VLSI) Systems vol. 9, Issue 4, Aug. 2001 pp. 509-523.

Larsen, S. et al., "Increasing and Detecting Memory Address Congruence," Proceedings of the 2002 IEEE International Conference on Parallel Architectures and Compilation Techniques (PACT'02), pp. 1-12 (Sep. 2002).

Mei, Bingfeng, "A Coarse-Grained Reconfigurable Architecture Template and Its Compilation Techniques," Katholeike Universiteit Leuven, PhD Thesis, Jan. 2005, IMEC vzw, Universitair Micro-Electronica Centrum, Belgium, pp. 1-195 (and Table of Contents).

Mei, Bingfeng, et al., "Design and Optimization of Dynamically Reconfigurable Embedded Systems," IMEC vzw, 2003, Belgium, 7 pages, http://www.imec.be/reconfigurable/pdf/ICERSA_01_design.pdf.

Miyamori, T. et al., "REMARC: Reconfigurable Multimedia Array Coprocessor," Computer Systems Laboratory, Stanford University, IEICE Transactions on Information and Systems E Series D, 1999; (abstract): Proceedings of the 1998 ACM/SIGDA sixth international symposium on Field programmable gate arrays, p. 261, Feb. 22-25, 1998, Monterey, California, United States, pp. 1-12.

Muchnick, S., "Advanced Compiler Design and Implementation" (Morgan Kaufmann 1997), Table of Contents, 11 pages.

Murphy, C., "Virtual Hardware Using Dynamic Reconfigurable Field Programmable Gate Arrays," Engineering Development Centre, Liverpool John Moores University, UK, GERI Annual Research Symposium 2005, 8 pages.

Nageldinger, U., "Design-Space Exploration for Coarse Grained Reconfigurable Architectures," (Dissertation) Universitaet Kaiserslautern, 2000, Chapter 2, pp. 19-45.

Olukotun, K., "The Case for a Single-Chip Microprocessor," ACM Sigplan Notices, ACM, Association for Computing Machinery, New York, vol. 31, No. 9, Sep. 1996 pp. 2-11.

PACT Corporation, "The XPP Communication System," Technical Report 15 (2000), pp. 1-16.

Parhami, B., "Parallel Counters for Signed Binary Signals," Signals, Systems and Computers, 1989, Twenty-Third Asilomar Conference, vol. 1, pp. 513-516.

Saleeba, Z.M.G., "A Self-Reconfiguring Computer System," Department of Computer Science, Monash University (Dissertation) 1998, pp. 1-306.

Singh, H. et al., "MorphoSys: an Integrated Reconfigurable System for Data-Parallel Computation-Intensive Applications," University of California, Irvine, CA. and Federal University of Rio de Janeiro, Brazil, 2000, IEEE Transactions on Computers, pp. 1-35.

Soni, M., "VLSI Implementation of a Wormhole Run-time Reconfigurable Processor," Jun. 2001, (Masters Thesis)Virginia Polytechnic Institute and State University, 88 pages.

Vasell et al., "The Function Processor: A Data-Driven Processor Array for Irregular Computations," Chalmers University of Technology, Sweden, pp. 1-21.

Waingold, E., et al., "Baring it all to software: Raw machines," IEEE Computer, Sep. 1997, at 86-93.

Weinhardt, Markus et al., "Memory Access Optimization for Reconfigurable Systems," IEEE Proceedings Computers and Digital Techniques, 48(3) (May 2001) pp. 1-16.

Wolfe, M. et al., "High Performance Compilers for Parallel Computing" (Addison-Wesley 1996) Table of Contents, 11 pages.

Xilinx, "Virtex-E 1.8 V Extended Memory Field Programmable Gate Arrays," Jul. 17, 2002, Xilinx Production Product Specification, pp. 1-118.

Xilinx, "Virtex-II and Virtex-II Pro X FPGA User Guide," Mar. 28, 2007, Xilinx user guide, pp. 1-559.

Zima, H. et al., "Supercompilers for parallel and vector computers" (Addison-Wesley 1991) Table of Contents, 5 pages.

Asari, et al., "FeRAM circuit technology for system on a chip," *Proceedings First NASA/DoD Workshop on Evolvable Hardware*, pp. 193-197 (1999).

Lee, et al., "Multimedia extensions for general-purpose processors," *IEEE Workshop on Signal Processing Systems, SIPS 97—Design and Implementation*, pp. 9-23 (1997).

Pirsch, et al., "VLSI implementations of image and video multimedia processing systems," *IEEE Transactions on Circuits and Systems for Video Technology* 8(7): 878-891 (Nov. 1998).

Salefski, et al., "Re-configurable computing in wireless," *Annual ACM IEEE Design Automation Conference: Proceedings of the 38th conference on Design automation*, pp. 178-183 (2001).

Schmidt, et al., "Datawave: A Single-Chip Multiprocessor for Video Applications," *IEEE Micro* 11(3): 22-25 and 88-94 (Jun. 1991).

Altera, "APEX 20K Programmable Logic Device Family," Altera Corporation Data Sheet, Mar. 2004, ver. 5.1, pp. 1-117.

IMEC, "ADRES multimedia processor & 3MF multimedia platform," Transferable IP, IMEC Technology Description, (Applicants believe the date to be Oct. 2005), 3 pages.

Kanter, David, "NVIDIA's GT200: Inside a Parallel Processor," http://www.realworldtech.com/page.cfm?ArticleID=RWT090989195242&p=1, Sep. 8, 2008, 27 pages.

Xilinx, "Virtex-E, 1.8 V Extended Memory Field Programmable Gate Arrays," (v2.2) Sep. 10, 2002, Xilinx Production Product Specification, pp. 1-52.

Xilinx, "Virtex-II and Virtex-II Pro X FPGA Platform FPGAs: Complete Data Sheet," (v4.6) Mar. 5, 2007, pp. 1-302.

Xilinx, "Virtex-II Platform FPGAs: Complete Data Sheet," (v3.5) Nov. 5, 2007, pp. 1-226.
Agaiwal, A., et al., "APRIL: A Processor Architecture for Multiprocessing," Laboratory for Computer Science, MIT, Cambridge, MA, IEEE 1990, pp. 104-114.
Almasi and Gottlieb, *Highly Parallel Computing*, The Benjamin/Cummings Publishing Company, Inc., Redwood City, CA, 1989, 3 pages. (Fig. 4.1).
Advanced RISC Machines Ltd (ARM), "AMBA—Advanced Microcontroller Bus Architecture Specification," (Document No. ARM IHI 0001C), Sep. 1995, 72 pages.
Alfke, Peter; New, Bernie, *Xilinx Application Note*, "Additional XC3000 Data," XAPP 024.000, 1994, pp. 8-11 through 8-20.
Alfke, Peter; New, Bernie, *Xilinx Application Note*, "Adders, Subtracters and Accumulators in XC3000," XAPP 022.000, 1994, pp. 8-98 through 8-104.
Alfke, Peter, *Xilinx Application Note*, "Megabit FIFO in Two Chips: One LCA Device and One DRAM," XAPP 030.000, 1994, pp. 8-148 through 8-150.
Alfke, Peter, *Xilinx Application Note*, "Dynamic Reconfiguration," XAPP 093, Nov. 10, 1997, pp. 13-45 through 13-46.
Alfke, Peter; New, Bernie, *Xilinx Application Note*, "Implementing State Machines in LCA Devices," XAPP 027.001, 1994, pp. 8-169 through 8-172.
Algotronix, Ltd., CAL64K Preliminary Data Sheet, Apr. 1989, pp. 1-24.
Algotronix, Ltd., CAL4096 Datasheet, 1992, pp. 1-53.
Algotronix, Ltd., CHS2x4 User Manual, "CHA2x4 Custom Computer," 1991, pp. 1-38.
Allaire, Bill; Fischer, Bud, *Xilinx Application Note*, "Block Adaptive Filter," XAPP 055, Aug. 15, 1996 (Version 1.0), pp. 1-10.
Altera Application Note (73), "Implementing FIR Filters in FLEX Devices," Altera Corporation, Feb. 1998, ver. 1.01, pp. 1-23.
Athanas, P. (Thesis), "An adaptive machine architecture and compiler for dynamic processor reconfiguration," Brown University 1992, pp. 1-157.
Berkeley Design Technology, Inc., *Buyer's Guide to DSP Processors*, 1995, Fremont, CA., pp. 673-698.
Bittner, R. et al., "Colt: An Experiment in Wormhole Run-Time Reconfiguration," Bradley Department of Electrical and Computer Engineering, Blacksburg, VA, SPIE—International Society for Optical Engineering, vol. 2914/187, Nov. 1996, Boston, MA, pp. 187-194.
Camilleri, Nick; Lockhard, Chris, *Xilinx Application Note*, "Improving XC4000 Design Performance," XAPP 043.000, 1994, pp. 8-21 through 8-35.
Cartier, Lois, *Xilinx Application Note*, "System Design with New XC4000EX I/O Features," Feb. 21, 1996, pp. 1-8.
Chen, D., (Thesis) "Programmable arithmetic devices for high speed digital signal processing," U. California Berkeley 1992, pp. 1-175.
Churcher, S., et al., "The XC6200 FastMap TM Processor Interface," Xilinx, Inc., Aug. 1995, pp. 1-8.
Cowie, Beth, *Xilinx Application Note*, "High Performance, Low Area, Interpolator Design for the XC6200," XAPP 081, May 7, 1997 (Version 1.0), pp. 1-10.
Duncan, Ann, *Xilinx Application Note*, "A32x16 Reconfigurable Correlator for the XC6200," XAPP 084, Jul. 25, 1997 (Version 1.0), pp. 1-14.
Ebeling, C., et al., "RaPiD—Reconfigurable Pipelined Datapath," Dept. of Computer Science and Engineering, U. Washington, 1996, pp. 126-135.
Epstein, D., "IBM Extends DSP Performance with Mfast—Powerful Chip Uses Mesh Architecture to Accelerate Graphics, Video," 1995 MicroDesign Resources, vol. 9, No. 16, Dec. 4, 1995, pp. 231-236.
Fawcett, B., "New SRAM-Based FPGA Architectures Address New Applications," Xilinx, Inc. San Jose, CA, Nov. 1995, pp. 231-236.
Goslin, G; Newgard, B, *Xilinx Application Note*, "16-Tap, 8-Bit FIR Filter Applications Guide," Nov. 21, 1994, pp. 1-5.
Iwanczuk, Roman, *Xilinx Application Note*, "Using the XC4000 RAM Capability," XAPP 031.000, 1994, pp. 8-127 through 8-138.
Knapp, Steven, "Using Programmable Logic to Accelerate DSP Functions," Xilinx, Inc., 1995, pp. 1-8.

New, Bernie, *Xilinx Application Note*, "Accelerating Loadable Counters in SC4000," XAPP 023.001, 1994, pp. 8-82 through 8-85.
New, Bernie, *Xilinx Application Note*, "Boundary Scan Emulator for XC3000," XAPP 007.001, 1994, pp. 8-53 through 8-59.
New, Bernie, *Xilinx Application Note*, "Ultra-Fast Synchronous Counters," XAPP 014.001, 1994, pp. 8-78 through 8-81.
New, Bernie, *Xilinx Application Note*, "Using the Dedicated Carry Logic in XC4000," XAPP 013.001, 1994, pp. 8-105 through 8-115.
New, Bernie, *Xilinx Application Note*, "Complex Digital Waveform Generator," XAPP 008.002, 1994, pp. 8-163 through 8-164.
New, Bernie, *Xilinx Application Note*, "Bus-Structured Serial Input-Output Device," XAPP 010.001, 1994, pp. 8-181 through 8-182.
Ridgeway, David, *Xilinx Application Note*, "Designing Complex 2-Dimensional Convolution Filters," XAPP 037.000, 1994, pp. 8-175 through 8-177.
Rowson, J., et al., "Second-generation compilers optimize semicustom circuits," Electronic Design, Feb. 19, 1987, pp. 92-96.
Schewel, J., "A Hardware/Software Co-Design System using Configurable Computing Technology," Virtual Computer Corporation, Reseda, CA, IEEE 1998, pp. 620-625.
Segers, Dennis, Xilinx Memorandum, "MIKE—Product Description and MRD," Jun. 8, 1994, pp. 1-29.
Texas Instruments, "TMS320C8x System-Level Synopsis," Sep. 1995, 75 pages.
Texas Instruments, "TMS320C80 Digital Signal Processor," Data Sheet, Digital Signal Processing Solutions 1997, 171 pages.
Texas Instruments, "TMS320C80 (MVP) Parallel Processor," User's Guide, Digital Signal Processing Products 1995, 73 pages.
Trainor, D.W., et al., "Implementation of the 2D DCT Using a Xilinx XC6264 FPGA," 1997, IEEE Workshop of Signal Processing Systems SiPS 97, pp. 541-550.
Trimberger, S, (Ed.) et al., "Field-Programmable Gate Array Technology," 1994, Kluwer Academic Press, pp. 1-258 (and the Title Page, Table of Contents, and Preface) [274 pages total].
Trimberger, S., "A Reprogrammable Gate Array and Applications," IEEE 1993, Proceedings of the IEEE, vol. 81, No. 7, Jul. 1993, pp. 1030-1041.
Trimberger, S., et al., "A Time-Multiplexed FPGA," Xilinx, Inc., 1997 IEEE, pp. 22-28.
Ujvari, Dan, *Xilinx Application Note*, "Digital Mixer in an XC7272," XAPP 035.002, 1994, p. 1.
Veendrick, H., et al., "A 1.5 GIPS video signal processor (VSP)," Philips Research Laboratories, The Netherlands, IEEE 1994 Custom Integrated Circuits Conference, pp. 95-98.
Wilkie, Bill, *Xilinx Application Note*, "Interfacing XC6200 to Microprocessors (TMS320C50 Example)," XAPP 064, Oct. 9, 1996 (Version 1.1), pp. 1-9.
Wilkie, Bill, *Xilinx Application Note*, "Interfacing XC6200 to Microprocessors (MC68020 Example)," XAPP 063, Oct. 9, 1996 (Version 1.1), pp. 1-8.
XCell, Issue 18, Third Quarter 1995, "Introducing three new FPGA Families!"; "Introducing the XC6200 FPGA Architecture: The First FPGA Architecture Optimized for Coprocessing in Embedded System Applications," 40 pages.
*Xilinx Application Note*, Advanced Product Specification, "XC6200 Field Programmable Gate Arrays," Jun. 1, 1996 (Version 1.0), pp. 4-253-4-286.
*Xilinx Application Note*, A Fast Constant Coefficient Multiplier for the XC6200, XAPP 082, Aug. 24, 1997 (Version 1.0), pp. 1-5.
Xilinx Technical Data, "XC5200 Logic Cell Array Family," Preliminary (v1.0), Apr. 1995, pp. 1-43.
Xilinx Data Book, "The Programmable Logic Data Book," 1996, 909 pages.
Xilinx, Series 6000 User's Guide, Jun. 26, 1997, 223 pages.
Yeung, K., (Thesis) "A Data-Driven Multiprocessor Architecture for High Throughput Digital Signal Processing," Electronics Research Laboratory, U. California Berkeley, Jul. 10, 1995, pp. 1-153.
Yeung, L., et al., "A 2.4GOPS Data-Driven Reconfigurable Multiprocessor IC for DSP," Dept. of EECS, U. California Berkeley, 1995 IEEE International Solid State Circuits Conference, pp. 108-110.
ZILOG Preliminary Product Specification, "Z86C95 CMOS Z8 Digital Signal Processor," 1992, pp. 1-82.

ZILOG Preliminary Product Specification, "Z89120 Z89920 (ROMless) 16-Bit Mixed Signal Processor," 1992, pp. 1-82.

Defendants' Invalidity Contentions in *PACT XPP Technologies, AG v. Xilinx, Inc.*, et al., (E.D. Texas Dec. 28, 2007) (No. 2:07cv563)., including Exhibits A through K in separate PDF files.

Advanced RISC Machines, "Introduction to AMBA," Section 1, pp. 1-1 to 1-7 (Oct. 1996).

ARM, "The Architecture for the Digital World," http://www.arm.com/products, 3 pages (Mar. 18, 2009).

ARM, "The Architecture for the Digital World; Milestones," http://www.arm.com/aboutarm/milestones.html, 5 pages (Mar. 18, 2009).

Del Corso, et al., "Microcomputer Buses and Links," Academic Press Inc. Ltd., pp. 138-143, 277-285 (1986).

"IEEE Standard Test Access Port and Boundary-Scan Architecture," IEEE Std. 1149.1-1990, pp. 1-127 (1993).

PCI Local Bus Specification, Production Version, Revision 2.1, Portland, OR, pp. 1-281 (Jun. 1, 1995).

"The Programmable Logic Data Book," Xilinx, Inc., Section 2, pp. 1-240, Section 8, pp. 1, 23-25, 29, 45-52, 169-172 (1994).

Ryo, A., "Auszug aus Handbuch der Informationsverarbeitung," Information Processing Society of Japan, ed., *Information Processing Handbook, New Edition*, Software Information Center, Ohmsha, Dec. 1998, 4 pages. [Translation provided].

Bondalapati et al., "Reconfigurable Meshes: Theory and Practice," Dept. of Electrical Engineering-Systems, Univ. of Southern California, Apr. 1997, Reconfigurable Architectures Workshop, International Parallel Processing Symposium, 15 pages.

Cherbaka, Mark F., "Verification and Configuration of a Run-time Reconfigurable Custom Computing Integrated Circuit for DSP Applications," Thesis: Virginia Polytechnic Institute and State University, Jul. 8, 1996, 106 pages.

Cong et al., "Structural Gate Decomposition for Depth-Optimal Technology Mapping in LUT-Based FPGA Designs," Univ. of California, ACM Transactions on Design Automation of Electronic Systems, vol. 5, No. 2, Apr. 2000, pp. 193-225.

FOLDOC, The Free On-Line Dictionary of Computing, "handshaking," online Jan. 13, 1995, retrieved from Internet Jan. 23, 2011 at http://foldoc.org/handshake.

Li et al., "Hardware-Software Co-Design of Embedded Reconfigurable Architectures," Los Angeles, CA, 2000, ACM, pp. 507-512.

Marshall et al., "A Reconfigurable Arithmetic Array for Multimedia Applications," FPGA '99 Proceedings of the 1999 ACM/SIGDA Seventh International Symposium on Field Programmable Gate Arrays, 10 pages.

Melvin, Stephen et al., "Hardware Support for Large Atomic Units in Dynamically Scheduled Machines," Computer Science Division, University of California, Berkeley, IEEE (1988), pp. 60-63.

Pistorius et al., "Generation of Very Large Circuits to Benchmark the Partitioning of FPGAs," Monterey, CA, 1999, ACM, pp. 67-73.

Roterberg, Eric., et al., "Trace Cache: a Low Latency Approach to High Bandwidth Instruction Fetching," Proceedings of the 29$^{th}$ Annual International Symposium on Michoarchitecture, Paris, France, IEEE (1996), 12 pages.

Translation of DE 101 39 170 by examiner using Google Trinslate, 10 pages.

Huang, Libo et al., "A New Architecture for Multiple-Precision Floating-Point Multiply-Add Fused Unit Design," School of Computer National University of Defense Technology, China, IEEE 2007, 8 pages.

Jo, Manhwee et al., "Implementation of Floating-Point Operations for 3D Graphics on a Coarse-Grained Reconfigurable Architecture," Design Automation Laboratory, School of EE/CS, Seoul National University, Korea, IEEE 2007, pp. 127-130.

Xilinx, White Paper 370: (Virtex-6 and Spartan-6 FPGA Families) "Reducing Switching Power with Intelligent Clock Gating," Frederic Rivoallon, May 3, 2010, pp. 1-5.

Xilinx, White Paper 298: (Spartan-6 and Virtex-6 Devices) "Power Consumption at 40 and 50 nm," Matt Klein, Apr. 13, 2009, pp. 1-21.

Becker, J., "A Partitioning Compiler for Computers with Xputer-based Accelerators," 1997, Kaiserslautern University, 326 pp.

Hartenstein et al., "Parallelizing Compilation for a Novel Data-Parallel Architecture," 1995, PCAT-94, Parallel Computing: Technology and Practice, 13 pp.

Hartenstein et al., "A Two-Level Co-Design Framework for Xputer-based Data-driven Reconfigurable Accelerators," 1997, Proceedings of the Thirtieth Annual Hawaii International Conference on System Sciences, 10 pp.

Altera, "2. TriMatrix Embedded Memory Blocks in Stratix & Stratix GX Devices," Altera Corporation, Jul. 2005, 28 pages.

Altera, "APEX II Programmable Logic Device Family," Altera Corporation Data Sheet, Aug. 2002, Ver. 3.0, 99 pages.

"BlueGene/L—Hardware Architecture Overview," BlueGene/L design team, IBM Research, Oct. 17, 2003 slide presentation, pp. 1-23.

"BlueGene/L: the next generation of scalable supercomputer," Kissel et al., Lawrence Livermore National Laboratory, Livermore, California, Nov. 18, 2002, 29 pages.

BlueGene Project Update, Jan. 2002, IBM slide presentation, 20 pages.

BlueGene/L, "An Overview of the BlueGene/L Supercomputer," The BlueGene/L Team, IBM and Lawrence Livermore National Laboratory, 2002 IEEE. pp. 1-22.

Epstein, Dave, "IBM Extends DSP Performance with Mfaxt," Microprocessor Report, vol. 9, No. 16 (MicroDesign Resources), Dec. 4, 1995, pp. 1-4 [XL0029013].

Galanis, M.D. et al., "Accelerating Applications by Mapping Critical Kernels on Coarse-Grain Reconfigurable Hardware in Hybrid Systems," Proceedings of the 13$^{th}$ Annual IEEE Symposium on Field-Programmable Custom Computing Machines, 2005, 2 pages.

Guo, Z. et al., "A Compiler Intermediate Representation for Reconfigurable Fabrics," University of California, Riverside, Dept. of Electrical Engineering, IEEE 2006, 4 pages.

Gwennap, Linley, "P6 Underscores Intel's Lead," Microprocessor Report, vol. 9., No. 2, Feb. 16, 1995 (MicroDesign Resources), p. 1 and pp. 6-15.

Gwennap, Linley, "Intel's P6 Bus Designed for Multiprocessing," Microprocessor Report, vol. 9, No. 7 (MicroDesign Resources), May 30, 1995, p. 1 and pp. 6-10.

Intel, "Pentium Pro Family Developer's Manual , vol. 3: Operating System Writer's Guide," Intel Corporation, Dec. 1995, [submitted in 4 PDF files: Part I, Part II, Part III and Part IV], 458 pages.

Cardoso, J.M.P & Weinhardt, M., "Compilation and Temporal Portioning for a Coarse-Grain Reconfigurable Architecture," Lysacht, P. & Rosentiel, W. eds., "New Algorithms, Architectures and Applications for Reconfigurable Computing," (2005) pp. 105-115, XP002436953.

Cardoso, J.M.P et al., "Macro-Based Hardware Compilation of Java™ Bytecodes into a Dynamic Reconfigurable Computing System," Field-Programmable Custom Computing Machines (1999) FCCM '99. Proceedings. Seventh Annual IEEE Symposium on Napa Valley, CA, USA, Apr. 21-23, 1999, IEEE Comput. Soc, US, (Apr. 21, 1999) pp. 2-11, XP010359161.

Cardoso, J.M.P et al., "XPP-VC: A C Compiler with Temporal Partitioning for the PACT-XPP Architecture," Lecture Notes in Computer Science (2002) vol. 2438, pp. 864-874, XP002376740.

Cook, Jefferey J., "The Amalgam Compiler Infrastructure," Thesis at the University of Illinois at Urbana-Champaign (2004) Chapter 7 & Appendix G, XP002436938.

Dongwan, S., et al., "C-based Interactive RTL Design Methodology," Technical Report CECS-03-42 (Dec. 2003) pp. 4-5, XP002436937.

Fawcett, B.K., "Map, Place and Route: The Key to High-Density PLD Implementation," Wescon Conference, IEEE Center (Nov. 7, 1995) pp. 292-297, XP000586585.

Hendrich, N., et al., "Silicon Compilation and Rapid Prototyping of Microprogrammed VLSI-Circuits with MIMOLA and SOLO 1400," Microprocessing & Microprogramming (Sep. 1992) vol. 35(1-5), pp. 4-5, XP002436933.

Koch, Andreas & Kasprzyk, Nico, "High-Level-Language Compilation for Reconfigurable Computers," Proceedings of European Workshop on Reconfigurable Communication-Centric SOCS (Jun. 2005) pp. 5-7, XP002436935.

Moraes, F., et al., "A Physical Synthesis Design Flow Based on Virtual Components," XV Conference on Design of Circuits and Integrated Systems (Nov. 2000) p. 2, XP002436934.

Neumann, T., et al., "A Generic Library for Adaptive Computing Environments," Field Programmable Logic and Applications, 11th International Conference, FPL 2001, Proceedings (Lecture Notes in Computer Science, vol. 2147) (2001) pp. 503-512, XP002436936.

Schonfeld, M., et al., "The LISA Design Environment for the Synthesis of Array Processors Including Memories for the Data Transfer and Fault Tolerance by Reconfiguration and Coding Techniques," J. VLSI Signal Processing Systems for Signal, Image, and Video Technology, (Oct. 1, 1995) vol. 11(1/2), pp. 7-9, XP000541354.

Sondervan, J., "Retiming and logic synthesis," Electronic Engineering (Jan. 1993) vol. 65(793), pp. 33, 35-36, XP000335044.

International Search Report of Application No. PCT/EP2007/000380, dated Jun. 22, 2007.

U.S. Appl. No. 90/010,979, filed May 4, 2010, Vorbach et al.

U.S. Appl. No. 90/011,087, filed Jul. 8, 2010, Vorbach et al.

Hauser, John Reid, (Dissertation) "Augmenting a Microprocessor with Reconfigurable Hardware," University of California, Berkeley, Fall 2000, 255 pages. (submitted in 3 PDFs, Parts 1-3).

Hauser, John R., "The Garp Architecture,"University of California at Berkeley, Computer Science Division, Oct. 1997, pp. 1-55.

Venkatachalam et al., "A highly flexible, distributed multiprocessor architecture for network processing," Computer Networks, The International Journal of Computer and Telecommunications Networking, vol. 41, No. 5, Apr. 5, 2003, pp. 563-568.

Xilinx, Inc.'s and Avnet, Inc.'s Disclosure Pursuant to P.R. 4-2; *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, 4 pages.

Xilinx, Inc.'s and Avnet, Inc.'s Disclosure Pursuant to P.R. 4-1; *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, 9 pages.

Defendant's Claim Construction Chart for P.R. 4-2 Constructions and Extrinsic Evidence for Terms Proposed by Defendants, *PACT XPP Technologies. AG. v. Xilinx, Inc. and Avnet, Inc.*, Case No. 2:07-cv-00563-TJW-CE, U.S. District Court for the Eastern District of Texas, Dec. 28, 2007, pp. 1-19.

PACT's P.R. 4-1 List of Claim Terms for Construction, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-7.

PACT's P.R. 4-2 Preliminary Claim Constructions and Extrinsic Evidence, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-16, and Exhibits re Extrinsic Evidence Parts in seven (7) separate additional PDF files (Parts 1-7).

Ballagh et al., "Java Debug Hardware Models Using JBits," 8th Reconfigurable Architectures Workshop, 2001, 8 pages.

Bellows et al., "Designing Run-Time Reconfigurable Systems with JHDL," Journal of VLSI Signal Processing, vol. 28, Kluwer Academic Publishers, The Netherlands, 2001, pp. 29-45.

Guccione et al., "JBits: Java based interface for reconfigurable computing," Xilinx, Inc., San Jose, CA, 1999, 9 pages.

Price et al., "Debug ofReconfigurable Systems," Xilinx, Inc., San Jose, CA, Proceedings of SPIE, 2000, pp. 181-187.

Sundararajan et al., "Testing FPGA Devices Using JBits," Proc. MAPLD 2001, Maryland, USA, Katz (ed.), NASA, CA, 8 pages.

U.S. Appl. No. 90/010,450, filed Mar. 27, 2009.

Culler, D.E; Singh, J.P., "Parallel Computer Architecture," p. 17, 1999, Morgan Kaufmann, San Francisco, CA USA, XP002477559.

Short, Kenneth L., *Microprocessors and Programmed Logic*, Prentice Hall, Inc., New Jersey 1981, p. 34.

Webster's Ninth New Collegiate Dictionary, Merriam-Webster, Inc., 1990, p. 332 (definition of "dedicated").

Chaudhry, G.M. et al., "Separated caches and buses for multiprocessor system," Circuits and Systems, 1993; Proceedings of the 36th Midwest Symposium on Detroit, MI, USA, Aug. 16-18, 1993, New York, NY IEEE, Aug. 16, 1993, pp. 1113-1116, XP010119918 ISBN: 0-7803-1760-2.

Culler, D.E; Singh, J.P., "Parallel Computer Architecture," pp. 434-437, 1999, Morgan Kaufmann, San Francisco, CA USA, XP002477559.

Jantsch, Axel et al., "Hardware/Software Partitioning and Minimizing Memory Interface Traffic," Electronic System Design Laboratory, Royal Institute of Technology, ESDLab, Electrum 229, S-16440 Kista, Sweden (Apr. 1994), pp. 226-231.

Lange, H. et al., "Memory access schemes for configurable processors,"Field-Programmable Logic and Applications, International Workshop, FPL, Aug. 27, 2000, pp. 615-625, XP02283963.

Lee, Ming-Hau et al., "Designs and Implementation of the MorphoSys Reconfigurable Computing Processors," The Journal of VLSI Signal Processing, Kluwer Academic Publishers, BO, vol. 24, No. 2-3, Mar. 2, 2000, pp. 1-29.

Ohmsha, "Information Processing Handbook," edited by the Information Processing Society of Japan,pp. 376, Dec. 21, 1998.

Altera, "Implementing High-Speed Search Applications with Altera CAM," Jul. 2001, Ver. 2.1, Application Note 119, 50 pages.

Bolsens, Ivo (CTO Xilinx), "FPGA, a history of interconnect," Xilinx slide presentation, posted on the Internet Oct. 30, 2008 at http://www.doestoc.com/docs/2198008/FPGA-a-history-of-interconnect, 32 pages.

Ramanathan et al., "Reconfigurable Filter Coprocessor Architecture for DSP Applications," Journal of VLSI Signal Processing, 2000, vol. 26, pp. 333-359.

Shanley, Tom, *Pentium Pro and Pentium II System Architecture*, MindShare, Inc., Addition Wesley, 1998, Second Edition, pp. 11-17; Chapter 7; Chapter 10; pp. 209-211, and p. 394.

Shoup, Richard, "Programmable Cellular Logic Arrays," Dissertation, Computer Science Department, Carnegie-Mellon University, Mar. 1970, 193 pages.

Zucker, Daniel F., "A Comparison of Hardware Prefetching Techniques for Multimedia Benchmarks," Technical Report: CSL-TR-95-683, Dec. 1995, 26 pages.

Microsoft Press Computer Dictionary, Third Edition, Redmond, WA, 1997, 3 pages.

Microsoft Press Computer Dictionary, Second Edition, Redmond, WA, 1994, 3 pages.

A Dictionary of Computing, Fourth Edition, Oxford University Press, 1997, 4 pages.

Communications Standard Dictionary, Third Edition, Martin Weik (Ed.), Chapman & Hall, 1996, 3 pages.

Dictionary of Communications Technology, Terms Definitions and Abbreviations, Second Edition, Gilbert Held (Ed.), John Wiley & Sons, England, 1995, 5 pages.

The Random House College Dictionary, Revised Edition, Random House, Inc., 1984, 14 pages.

The Random House College Dictionary, Revised Edition, Random House, Inc., 1984, 7 pages.

Random House Webster's College Dictionary with CD-ROM, Random House, 2001, 7 pages.

Random House Webster's College Dictionary with CD-ROM, Random House, 2001, 4 pages.

Random House Personal Computer Dictionary, Second Edition, Philip E. Margolis (Ed.), Random House, New York, 1996, 5 pages.

The IEEE Standard Dictionary of Electrical and Electronics Terms, Sixth Edition, 1996, 36 pages.

The IEEE Standard Dictionary of Electrical and Electronics Terms, Sixth Edition, 1996, 8 pages.

McGraw-Hill Electronics Dictionary, Sixth Edition, Neil Sclater et al. (Ed.), McGraw-Hill, 1997, 3 pages.

Modern Dictionary of Electronics, Sixth Edition, Rudolf Graf (Ed.), Newnes (Butterwoth-Heinemann), 1997, 5 pages.

The American Heritage Dictionary, Fourth Edition, Dell (Houghton-Mifflin), 2001, 5 pages.

The American Heritage Dictionary, Second College Edition, Houghton Mifflin, 1982, 23 pages.

The American Heritage Dictionary, Second College Edition, Houghton Mifflin, 1982, 8 pages.

The American Heritage Dictionary, Third Edition, Dell Publishing (Bantam Doubleday Dell Publishing Group, Inc.), 1994, 4 pages.

The American Heritage Dictionary, Fourth Edition, Dell/Houghton Mifflin 2001, 5 pages.

Webster's New Collegiate Dictionary, Merriam Co., 1981, 5 pages.
Webster's New Collegiate Dictionary, Merriam Co., 1981, 4 pages.
The Oxford American Dictionary and Language Guide, Oxford University Press, 1999, 5 pages.
The Oxford Duden German Dictionary, Edited by the Dudenredaktion and the German Section of the Oxford University Press, W. Scholze-Stubenrecht et al. (Eds), Clarendon Press, Oxford, 1990, 7 pages.
Oxford Dictionary of Computing, Oxford University Press, 2008, 4 pages.
Modern Dictionary of Electronics, Sixth Edition Revised and Updated, Rudolf F. Graf (Ed.), Butterworth-Heinemann, 1997, 7 pages.
Modern Dictionary of Electronics, Sixth Edition Revised and Updated, Rudolf F. Graf (Ed.), Butterworth-Heinemann, 1997, 5 pages.
Garner's Modern American Usage, Bryan A. Garner (Ed.), Oxford University Press, 2003, 3 pages.
The New Fowler's Modern English Usage, R.W. Burchfield (Ed.), Oxford University Press, 2000, 3 pages.
Wikipedia, the free encyclopedia, "Granularity", at http://en.wikipedia.org/wiki/Granularity, Jun. 18, 2010, 4 pages.
Wordsmyth, The Premier Educational Dictionary—Thesaurus, at http://www.wordsmyth.net, "communication", Jun. 18, 2010, 1 page.
Yahoo! Education, "affect", at http://education.yahoo.com/reference/dictionary/entry/affect, Jun. 18, 2010, 2 pages.
mPulse Living Language, "high-level", at http://www.macmillandictionary.com/dictionary/american/hiah-level, Jun. 18, 2010, 1 page.
MSN Encarta, "regroup", at http://encarta.msn.com/encnet/features/dictionary/DictionaryResults.aspx?lextype=3&search=regroup, Jun. 17, 2010, 2 pages.
MSN Encarta, "synchronize", at http://encarta.msn.com/enenet/features/dictionary/DictionaryResults.aspx?lextype=3&search=synchronize, Jun. 17, 2010, 2 pages.
MSN Encarta, "pattern", at http://encarta.msn.com/encnet/features/dictionary/DictionaryResults.aspx?lextype=3&search=pattern, Jun. 17, 2010, 2 pages.
MSN Encarta, "dimension", at http://encarta.msn.com/encnet/features/dictionary/DictionaryResults.aspx?lextype=3&search=dimension, Jun. 17, 2010, 2 pages.
MSN Encarta, "communication", at http://encarta.msn.com/encnet/features/dictionary/DictionaryResults.aspx?lextype=3&search=communication, Jun. 17, 2010, 2 pages.
MSN Encarta, "arrangement", at http://encarta.msn.com/encnet/features/dictionary/DictionaryResults.aspx?lextype=3&search=arrangement, Jun. 17, 2010, 2 pages.
MSN Encarta, "vector", at http://encarta.msn.com/encnet/features/dictionary/DictionaryResults.aspx?lextype=3&search=vector, Jul. 30, 2010, 2 pages.
Dictionary.com, "address", at http://dictionary.reference.com/browse/address, Jun. 18, 2010, 4 pages.
P.R. 4-3 Joint Claim Constructions Statement, *PACT XPP Technologies, AG v. Xilinx, Inc.* and *Avnet, Inc et al.*, E.D. Texas, 2:07-cv-00563-CE, Jul. 19, 2010, pp. 1-50.
Order Granting Joint Motion for Leave to File an Amended Joint Claim Construction and Prehearing Statement and Joint Motion to File an Amended Joint Claim Construction and Prehearing Statement Pursuant to Local Patent Rule 4-3, and Exhibit A: P.R. 4-3 Amended Joint Claim Constructions Statement, *PACT XPP Technologies, AG v. Xilinx, Inc.* and *Avnet, Inc. et al.*, E.D. Texas, 2:07-cv-00563-CE, Aug. 2, 2010, 72 pages.
P.R. 4-3 Amended Joint Claim Constructions Statement, *PACT XPP Technologies, AG v. Xilinx, Inc.* and *Avnet, Inc. et al.*, E.D. Texas, 2:07-cv-00563-CE, Aug. 3, 2010, pp. 1-65.
Exhibit A—P.R. 4-3 Amended Joint Claim Constructions Statement, *PACT XPP Technologies, AG v. Xilinx, Inc.* and *Avnet, Inc. et al.*, E.D. Texas, 2:07-cv-00563-CE, Aug. 2, 2010, pp. 1-66.
PACT's Opening Claim Construction Brief, *PACT XPP Technologies, AG v. Xilinx, Inc.* and *Avnet, Inc.*, E.D. Texas, 2:07-cv-00563-CE, Nov. 1, 2010, pp. 1-55.
Declaration of Harry L. (Nick) Tredennick in Support of PACT's Claim Constructions, *PACT XPP Technologies, AG v. Xilinx, Inc.* and *Avnet, Inc. et al.*, E.D. Texas, 2:07-cv-00563-CE, Nov. 1, 2010, pp. 1-87.
Transcript of Harry (Nick) L. Tredennick III, Ph.D., Oct. 11, 2010, vol. 1, Exhibit 16 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-3.
Agreed and Disputed Terms, Exhibit 17 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-16.
Oral Videotaped Deposition—Joseph McAlexander dated Oct. 12, 2010, vol. 1, Exhibit 18 of PACT's Opening Claim Construction Brief, *PACT XPP Technologies, AG v. Xilinx, Inc.* and *Avnet, Inc. et al.*, E.D. Texas, 2:07-cv-00563-CE, Nov. I, 2010, pp. 1-17.
Expert Report of Joe McAlexander Re Claim Construction dated Sep. 27, 2010, Exhibit 19 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-112.
Documents from File History of U.S. Appl. No. 09/290,342, filed Apr. 12, 1999, Exhibit 20 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-37.
Amendment from File History of U.S. Appl. No. 10/156,397, filed May 28, 2002, Exhibit 25 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-12.
Documents from File History U.S. Appl. No. 09/329,132, filed Jun. 9, 1999, Exhibit 27 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-36.
Amendment from File History of U.S. Appl. No. 10/791,501, filed Mar. 1, 2004, Exhibit 39 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-9.
Amendment from File History of U.S. Appl. No. 10/265,846, filed Oct. 7, 2002, Exhibit 40 of PACT's Opening Claim Construction Brief, *PACT XPP Technologies, AG v. Xilinx, Inc.* and *Avnet, Inc. et al.*, E.D. Texas, 2:07-cv-00563-CE, Nov. 1, 2010, pp. 1-12.
Defendants Xilinx, Inc. and Avnet, Inc.'s Responsive Claim Construction Brief, *PACT XPP Technologies, AG v. Xilinx, Inc.* and *Avnet, Inc. et al.*, E.D. Texas, 2:07-cv-00563-CE, Dec. 6, 2010, pp. 1-55.
Declaration of Aaron Taggart in Support of Defendants Xilinx, Inc. and Avnet, Inc.'s Responsive Claim Construction Brief, Defendants Xilinx, Inc. and Avnet, Inc.'s Responsive Claim Construction Brief (Exhibit A), *PACT XPP Technologies, AG v. Xilinx, Inc.* and *Avnet, Inc. et al.*, E.D. Texas, 2:07-cv-00563-CE, Dec. 6, 2010, pp. 1-5.
Oral Videotaped Deposition Joseph McAlexander (Oct. 12, 2010), Exhibit 1 of Defendants Xilinx, Inc. and Avnet, Inc.'s Responsive Claim Construction Brief, *PACT XPP Technologies, AG v. Xilinx, Inc.* and *Avnet, Inc. et al.*, E.D. Texas, 2:07-cv-00563-CE, Dec. 6, 2010, pp. 1-9.
Expert Report of Joe McAlexander re Claim Construction, Exhibit 2 of Defendants Xilinx, Inc. and Avnet, Inc.'s Responsive Claim Construction Brief, *PACT XPP Technologies, AG v. Xilinx, Inc.* and *Avnet, Inc. et al.*, E.D. Texas, 2:07-cv-00563-CE, Dec. 6, 2010, pp. 1-137.
Various Documents from File History of U.S. Appl. No. 09/290,342, filed Apr. 12, 1999, Exhibit 6 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-181.
Transcript of Harry (Nick) L. Tredennick III, Ph.D., Oct. 11, 2010, vol. 1, Exhibit 7 of Defendants Xilinx, Inc. and Avnet, Inc.'s Responsive Claim Construction Brief, *PACT XPP Technologies, AG v. Xilinx, Inc.* and *Avnet, Inc. et al.*, E.D. Texas, 2:07-cv-00563-CE, Dec. 6, 2010, pp. 1-28.
Amendment, Response from File History of U.S. Appl. No. 10/156,397, filed May 28, 2002, Exhibit 15 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-137.

Application from File History of U.S. Appl. No. 08/544,435, filed Nov. 17, 1995, Exhibit 20 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-102.

Documents from File History of U.S. Appl. No. 09/329,132, filed Jun. 9, 1999, Exhibit 24 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-13.

Documents from File History of U.S. Appl. No. 10/791,501, filed Mar. 1, 2004, Exhibit 25 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2: 07-cv-00563-CE, Dec. 6, 2010, pp. 1-14.

Amendment from File History of U.S. Appl. No. 11/246,617, filed Oct. 7, 2005, Exhibit 26 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-9.

Documents from File History of U.S. Appl. No. 08/947,254, filed Oct. 8, 1997, Exhibit 27 of Defendants Xilinx, Inc. and Avnet, Inc.'s Responsive Claim Construction Brief, *PACT XPP Technologies, AG v. Xilinx, Inc.* and *Avnet, Inc. et al.*, E.D. Texas, 2:07-cv-00563-CE, Dec. 6, 2010, pp. 1-38.

Documents from File History of U.S. Appl. No. 08/947,254, filed Oct. 8, 1997, specifically, German priority application specification [English translation provided], Exhibit 33 of Defendants Xilinx, Inc. and Avnet, Inc.'s Responsive Claim Construction Brief, *PACT XPP Technologies, AG v. Xilinx, Inc.* and *Avnet, Inc. et al.*, E.D. Texas, 2:07-cv-00563-CE, Dec. 6, 2010, 54 pages [including English translation].

Documents from File History of U.S. Appl. No. 09/335,974, filed Jun. 18, 1999, Exhibit 28 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-32.

Documents from File History of U.S. Patent Reexamination Control No. 90/010,450 (filed Mar. 27, 2009), Exhibit 30 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-71.

Documents from File History of U.S. Appl. No. 10/265,846, filed Oct. 7, 2002, Exhibit 32 of Defendants Xilinx, Inc. and Avnet, Inc.'s Responsive Claim Construction Brief; *PACT XPP Technologies, AG v. Xilinx, Inc.* and *Avnet, Inc. et al.*, E.D. Texas, 2:07-cv-00563-CE, Dec. 6, 2010, pp. 1-23.

PACT's Claim Construction Reply Brief; *PACT XPP Technologies, AG v. Xilinx, Inc.* and *Avnet, Inc. et al.*, E.D. Texas, 2:07-cv-00563-CE, Jan. 7, 2011, pp. 1-20.

Defendants Xilinx, Inc. and Avnet, Inc.'s Claim Construction Surreply Brief; *PACT XPP Technologies, AG v. Xilinx, Inc.* and *Avnet, Inc. et al.*, E.D. Texas, 2:07-cv-00563-CE, Jan. 18, 2011, 142 pages.

Markman Hearing Minutes and Attorney Sign-In Sheet, *PACT XPP Technologies, AG v. Xilinx, Inc.* and *Avnet, Inc. et al.*, E.D. Texas, 2:07-cv-00563-CE, Feb. 22, 2011, 3 pages; and court transcript, 245 pages.

Memorandum Opinion and Order, *PACT XPP Technologies, AG v. Xilinx, Inc.* and *Avnet, Inc. et al.*, E.D. Texas, 2:07-cv-00563-CE, Jun. 17, 2011, pp. 1-71.

Atmel Corporation, Atmel 5-K—50K Gates Coprocessor FPGA and FreeRAM, (www.atmel.com), Apr. 2002 , pp. 1-68.

Glaskowsky, Peter N., "PACT Debuts Extreme Processor; Reconfigurable ALU Array Is Very Powerful- and Very Complex" Microprocessor, The Insider's Guide to Microprocessor Hardware, MicroDesign Resources—Microprocessor Report, Oct. 9, 2000 (www.MPRonline.com), 6 pages.

Glaskowsky, Peter N., "Analysis' Choice Nominees Named; Our Picks for 2002's Most Important Products and Technologies" Microprocessor, The Insider's Guide to Microprocessor Hardware, MicroDesign Resources—Microprocessor Report, Dec. 9, 2002 (www.MPRonline.com), 4 pages.

Lattice Semiconductor Corporation, ispLSI 2000E, 2000VE and 2000 VL Family Architectural Description, Oct. 2001, pp. 1-88.

Olukotun, K. et al., "Rationale, Design and Performance of the Hydra Multiprocessor," Computer Systems Laboratory, Stanford University, CA, Nov. 1994, pp. 1-19.

PACT Corporate Backgrounder, PACT company release, Oct. 2008, 4 pages.

Page, Ian., "Reconfigurable processor architectures," Oxford University Computing Laboratory, Oxford UK, Elsevier Science B.V., Microprocessors an Microsystems 20 (1996) pp. 185-196.

Singh, Hartej et al., "Morpho-Sys: A Reconfigurable Architecture for Multimedia Applications," Univ. of California, Irvine, CA and Federal University of Rio de Janeiro, Brazil, at http://www.eng.uci.edu/mornhosys/docs/sbcci98.html, 10 pages.

Theodoridis, G. et al., "Chapter 2—A Survey of Coarse-Grain Reconfigurable Architectures and Cad Tools, Basic Definitions, Critical Design Issues and Existing Coarse-grain Reconfigurable Systems," from S. Vassiliadis, and D. Soudris (eds.) *Fine- and Coarse-Grained Reconfigurable Computing*, Springer 2007, pp. 89-149.

Weinhardt, Markus et al., "Using Function Folding to Improve Silicon Efficiency of Reconfigurable Arithmetic Arrays," PACT XPP Technologies AG, Munich, Germany, IEEE 2004, pp. 239-245.

Xilinx, XC6200 Field Programmable Gate Arrays, Advance Product Specification, Jun. 1, 1996 (Version 1.0), pp. 4-255 through 4-286.

Xilinx, Virtex-II Platform FPGA User Guide, UG002 (V2.1) Mar. 28, 2007, pp. 1-502 [Parts 1-3].

Xilinx, XC4000E and SC4000X Serial Field Programmable Gate Arrays, Product Specification (Version 1.6), May 14, 1999, pp. 1-107.

\* cited by examiner

PACT25
PACT04 - Ping Pong
Double Buffering

PACT15 + PACT25

Coupling Variants
Module – Field
(following as well)

PACT18 (Butcher Protocol)

PACT08 + PACT25

Coupling Variants spatial arrangement of hard modules relative to the field

HARDWARE DEFINITION METHOD INCLUDING DETERMINING WHETHER TO IMPLEMENT A FUNCTION AS HARDWARE OR SOFTWARE

FIELD OF THE INVENTION

The present invention relates to a preferably reconfigurable architecture, or a preferably partially reconfigurable architecture, and a method for programming a cell element field, the elements of the field being able to execute a number of different functions, in particular such a multitude of functions that an all-purpose processor is obtained.

BACKGROUND INFORMATION

A method according the related art with respect to a design flow is shown in FIG. 1. FIG. 1 shows a known method of creating and programming a reconfigurable architecture in the sense of the remarks below. The figure shows on the right that a library containing modules for a larger chip is provided, which concerns, among other things, an ALU-PAE definition, a RAM-PAE definition etc. As required and specified, these different definitions are combined in an XPP generator and afterwards a synthesis is performed for the output obtained from the XPP generator in order to generate a mask set for the synthesized hardware on the basis of the result of the synthesis such that a chip may be produced.

The left side of the diagram shows a library for a number of programs (software parts) in a language such as NML, this special language being known from other publications of the applicant. Then a program is written by using such library software parts, it being obviously possible to use additionally and/or exclusively also software parts not contained in the library. The program is then compiled, compiling here being understood to include also placing and routing, as required. For this purpose, the compiler needs information that refers to the actual target hardware design. The compiler also has such information. The configuration(s) generated by the compiler are than made to run on the hardware as run time configuration.

It has alsoalready been proposed (WO 2004/114166) to provide a so-called bottom-up approach in hardware design, an integrated circuit development system having been provided, which included a description library of a multitude of hardware objects, which are each structured to operate on message packets, each object being intended to have relatively similar electrical load characteristics; and the integrated circuit development system further including a modeler, which refers to the library and is to be structured to accept an instruction that creates an instantiation of one of the descriptions and to accept a command that combines two or more of the created instantiations with one another. The laborious programming of this known method of instantiated hardware objects then provides for a collection of software objects to be accepted which are themselves to be abstractions of the instantiated hardware objects, each software object being intended to include a list of hardware objects that are used in the software object as well as a list of rules for combining the listed hardware objects and an instruction file that is to be loaded into the listed hardware objects; a description of the collection of physically instantiated hardware objects then having to be accepted; an identifier having to be allocated to each of the physically instantiated hardware objects from the list of hardware objects and an initialization file having to be created for the collection of physically instantiated hardware objects by using the identifier in order to replace symbolic information in the instruction files. The last-mentioned technique as shown in WO 2004/114166 is disadvantageous particularly because of the fact that it can neither be assumed with absolute reliability that a hardware-software isomorphism is actually given and not merely claimed, and because in addition the applications designed in accordance with the system must often provide for an excess of unnecessary hardware on a silicon chip. At the same time there is no assurance that in the known procedure according to WO 2004/114166 an optimal execution speed of the hardware objects tied together from predefined, invariable hardware modules is realized.

Furthermore, in the cited related art as shown in WO 2004/114166, it remains necessary for hardware engineers to design the hardware. It is not possible to leave the construction of a chip for a dedicated application to the programmer of the dedicated application entirely or at least largely.

SUMMARY

In the present application, a reconfigurable architecture is understood in the broadest sense as an architecture in which at least one of the elements processing, storing and/or transmitting cross-linkages of data is itself modifiable; in a preferred variant, the term reconfigurable architecture being understood, without this being referenced each time, as a dynamically reconfigurable architecture, unless the respective semantic context indicates otherwise. In this connection, dynamic can refer to the capability of reconfiguration occurring at a speed that allows for a complete and/or partial reconfiguration at run time; the reconfiguration may thus occur for all cell elements, connecting elements etc. of a field, only for a subgroup of a field and/or for an individual element of the field. The reconfiguration may be induced, reference being made here for disclosure purposes to earlier patent documents of the applicant which are all incorporated to their full extent, e.g., by a possibly separately built up and/or pre-loaded central entity, by an adjacent cell and/or a cell within the element itself, which determines in the course of the data processing performed by it that subsequently another or additional data processing is required prior to or during the transmission and/or output of the data to another cell or outside the cell element field. A reconfiguration of elements lying upstream in the data path may also be brought about. The reconfiguration may be forced from the outside, i.e., outside of the field, and/or from inside and/or may be requested. Reconfiguration information is transmittable over separate reconfiguration lines, (data) buses and/or in direction connection from cell to cell.

The direct data connection from cell to cell may occur alternatively and/or additionally to an interconnection of multiple cells by connection to longer regions stretching over extended parts of the field and/or by a reconfiguration entity and/or external units such as data memories, data sources and/or data receivers. Such data receivers or data sources may be, for example, displays, data interfaces, external (host) processors, co-processors, microcontrollers and/or chip-integrated sequencer units and the like.

Reconfiguration information may, e.g., also be transmitted together with the data, e.g., also internested in data words of a longer data packet, it being in any event possible for the data exchange between the cell elements to occur preferably in an asynchronous manner. The transmission of configuration data from cell to cell may occur by transmitting actual configuration words for configuring a configurable cell element and/or by transmitting triggers, in particular in trigger vector form, a selection being made by these triggers between a plurality of configurations still to be fed in and/or are already fed in for the trigger vector target receiver cell element.

It is preferred, but not absolutely necessary for the purposes of the present application, if at least one, preferably multiple configurations are stored for current and/or subsequent processing in or at the cell elements, it being possible to provide either a configuration memory in each cell and/or for a group of cells as known per se from the earlier patent documents of the applicant.

Reference should be made to hierarchical structures, which may be established by and for processor fields of the present kind, be it for configuration data and/or data to be processed. It should be mentioned that in a data stream trigger vectors may also be interposed in order to select between a plurality of different configurations, in particular configurations stored in advance, in the manner of a configuration ID. If, which is regarded as possible, several configurations are executable on one configurable cell element in a time-blending manner, as is provided for example in PCT/EP 02/02402 (PACT25/PCTE), all originating from the present applicant, then it may be possible in a preferred manner, to transmit along to the cell elements even in the data transmission information that relates to the association of a data packet with a certain task to be processed. With respect to these identifying specifications to be transmitted along with the data, reference is made to PCT/EP 02/02403 (PACT18/PCT), where particularly the explanations regarding APID should be compared, as well as in PCT/EP 02/10572 (PACT31/PCToe), where the explanations regarding CONFIGID should be compared. As far as the cell elements are concerned, it is per se possible that a currently considered reconfigurable architecture, for which a specific program is to be compiled, is a (fully) homogeneous field, in which for example as in the known XPP of the applicant a plurality of cells having in particular segmented buses in between are provided, it being possible, but not absolutely necessary, for the cells to be ALUs, in part having an extended range of function (EALUs), compare PCT/DE 97/02949 (PACT02/PCT), and (multi-stage) register units coupled to the input and output buses being possibly provided on both sides of the ALU, compare, e.g., FREG, BREC in PCT/EP 01/11299 (PACT22a/PCT), as well as respective refinements in other patent documents of the applicant. Furthermore, reference is made in this regard to input-output registers in front of the ALU itself, which under a different name are also found in other writings of the applicant.

For this purpose, the communication of the cell elements is preferably subjected to protocols such as the applicant has already described in connection with the XPP architecture. Mention should be made in particular of the RDY/ACK protocol, the RDY/ABLE protocol from PCT/DE 03/00489 (PACT16/PCTD) as well as the additional protocols described there such as CREDIT protocols etc., e.g., protocols having a reject option. As applicant has pointed out in earlier applications, possibly received, but no longer needed, data packets may be discarded. Here mention should be made only by way of example of PCT/EP 2004/003603 (PACT50/PCTE), which is likewise in its full extent relevant also for other purposes, such as for application purposes with respect to the reconfigurable architecture for instance in connection with hyperthreading, processor-coupling etc., and which for disclosure purposes is to be regarded as incorporated in its full extent.

The cell elements may take the form of and/or include in particular ALU-PAEs, EALU-PAEs, RAM-PAEs, RAM+ALU-PAEs, function-folding PAEs (see DE 10 2005 005 766.7, DE 10 2005 010 846.6, DE 10 2005 014 860.3, DE 10 2005 023 785.1, EP 05 005 832.0, EP 05 019 296.2, EP 05 020 297.7, EP 05 020 772.9, and (PACT62 ff)), graph-folding PAEs, sequencer structures connected via command lines as well as PAEs, which may have, in addition to a configurable or adjustable unit such as an ALU, a memory such as a circular buffer and the like, in particular those having several pointers etc., also parts firmly defined once in their function, for example FPGA-like logic circuits that are defined, FPGA-like groups that are reconfigurable only seldom and preferably without recourse to preferred, in particular faster configuration methods and/or logic circuits fixed in their functionality such as ASICs, which may be used for example for certain I/O protocols such as RS232, LAN, VGA, XVGA, DVI, USB, S/PDIF, Firewire, RAMBUS etc.

Furthermore, using the ASIC-like logic circuits, which may belong to the cell elements, it is possible to fall back on fixed functions, for example ASIC-like programmed DCT algorithms, FIR filters or IIR filters, VITERBI algorithms etc., which may be of significance for various applications such as in general purpose processors, general purpose co-processors, microcontrollers, sequencers, image editing and/or image processing such as for HDTV, cameras, base stations, mobile telephones, radio receivers (software-defined radio), smart antennas, CODECs and/or parts for these.

In order to be able to use such structures and methods of structure operation, the corresponding hardware must now be designed and data processing processes capable of being executed on this hardware must be defined.

Experience has shown that, as discussed above with respect to FIG. 1, it is already possible without problem to design hardware having the aforementioned architecture, protocols etc. and to write programs for it. As far as programs for the architecture are concerned, reference is made in particular to the NML language and the documentation, manuals and general descriptions existing for it. It should be mentioned that programming languages are known per se and are optionally applicable to the specific architecture as well. BASIC, LISP, COBOL, PL-M, ADA, ALGOL, FORTRAN, BASH, TCL, but also JAVA, C in various dialects such as C++, PASCAL, OBERON, EIFFEL, PERL, A, B, XML, UML are example possibly relevant high level programming languages.

Embodiments of the present invention make possible at least partial improvements in the design and/or with respect to the usability of structures and architectures mentioned at the outset.

DETAILED DESCRIPTION

Figure 1:
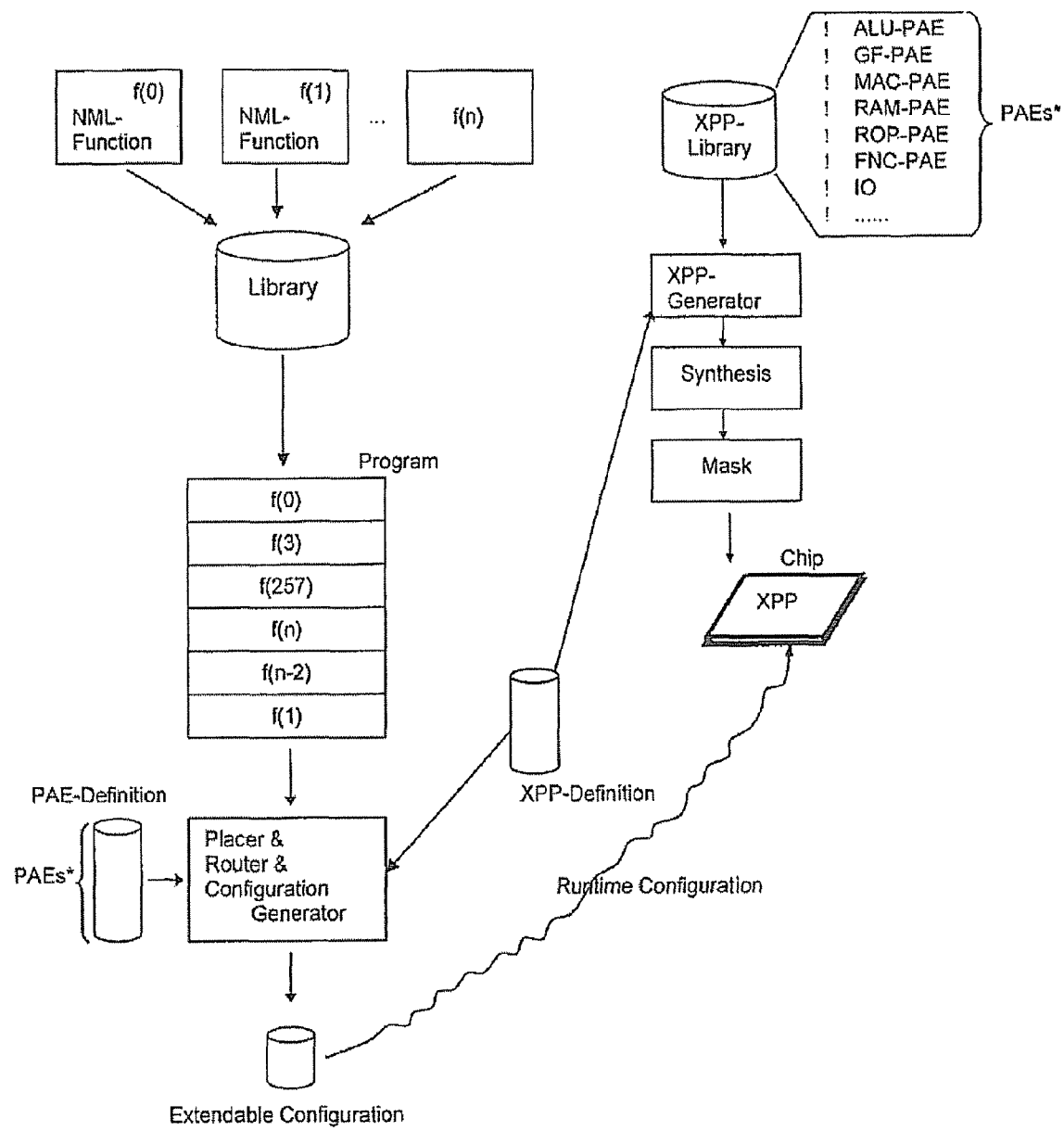
FIG. 1 shows a procedure according to the related art.
Figure 2:
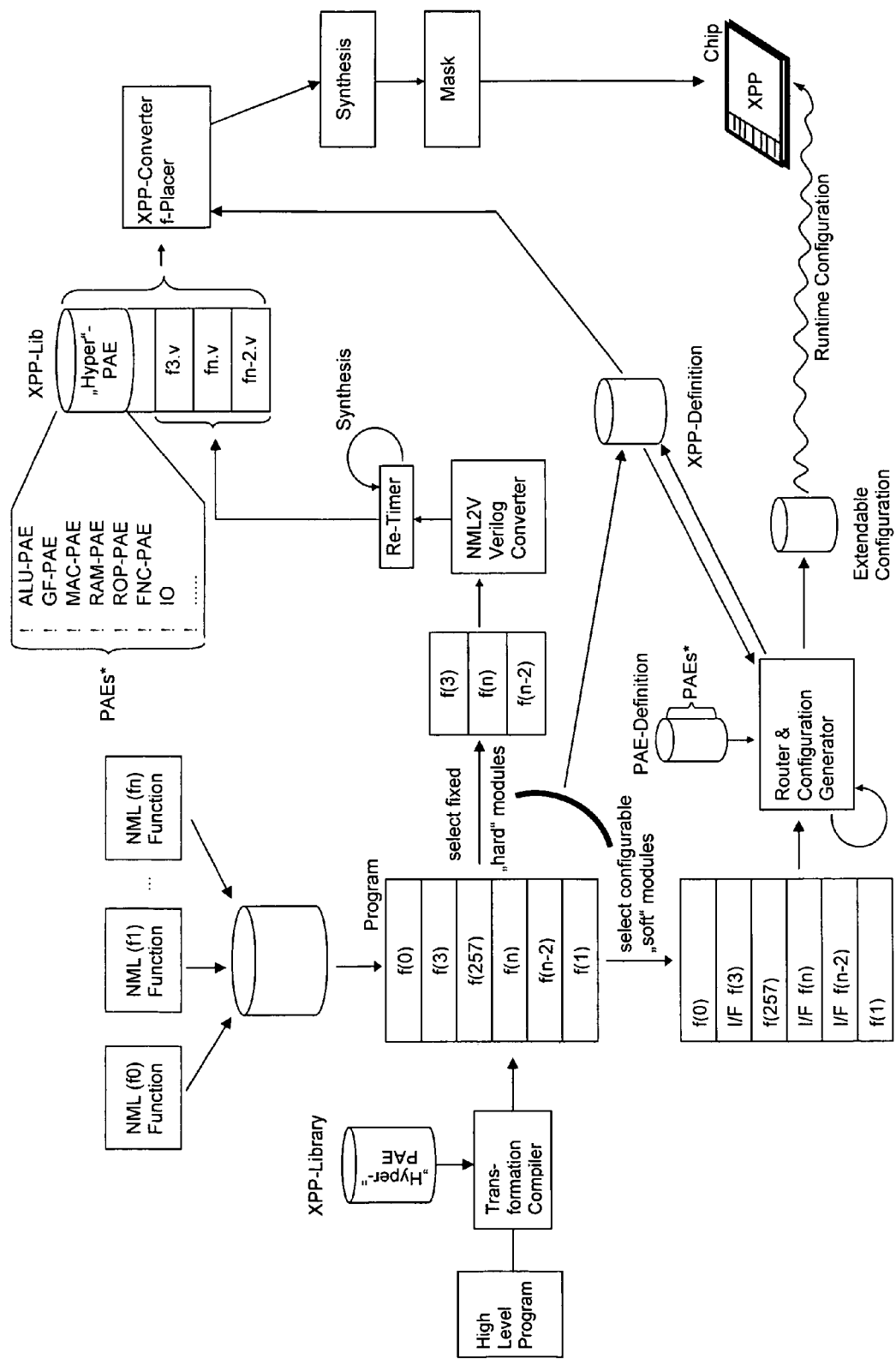
FIG. 2 shows an improved method in accordance with the present invention for creating and/or programming hardware.

As is yet to be explained below, FIG. 2 shows essentially parts of the design flow as is also known in FIG. 1 from the related art, but it supplements and extends or modifies it in an inventive manner. As will become apparent and be explained below, the following is of particular importance in this regard.

First, a high level language program is provided, in which initially no reference needs to be made to actual hardware characteristics. This program may be written in the conventional high level languages such as C++, JAVA, MATLAB etc. Thus, programming is performed in abstraction from any hardware, ergo at this point one preferably, but not necessarily, uses an entirely, at least partially hardware-abstracted language. These hardware-abstracted programs or this hardware-abstracted program is then translated as known per se preferably with reference to a quasi-maximally free hyperset, that is, a superset of possible hardware objects, which for individual objects may include a plurality of variants, these variants also for example, which is preferred, possibly differing from one another in a manner determinable by parameters in one or in multiple characteristics. When the hardware-abstracted high level language program is translated with reference to a quasi-maximally free hyperset of possible hardware structures etc., for the purpose of which a transformation compiler is used, then for this purpose one may fall back on a multitude of PAEs parameterized for this hyperset and similar suitable modules stored in a software library. The modules in the library may be intended for parameterized or still parameterizable elements of the hyperset, and, as the translation described above as performed by the transformation compiler, may occur both by machine coding as well as if desired entirely and/or partially manual coding. It should be mentioned that the use of modules in machine and/or manual translation is not absolutely necessary.

The parameterization may be performed interactively by a programmer, in particular by interaction with a place-and-route tool, but may also be suggested by the latter, possibly even in a fully automatic manner, and possibly only be confirmed and/or stipulated without confirmation. Alternatively, heuristic methods are possible as well, possibly even interactively and/or by open-loop and closed-loop control of a place-and-route tool. In heuristic methods, an iterative procedure using the place-and-route tool or another tool in the programming and hardware definition environment may be performed. It should be pointed out that such iterations may occur manually, semi-automatically and/or alternatively and particularly preferentially in a fully automatic manner.

With the heuristic, SETPOINT variables may be specified for this purpose, which are to be reached by the iteration, by trial and error for example. In this connection, for purposes of disclosure, explicit reference should be made to the methods of "simulated annealing."

In addition to methods of simulated annealing, obviously, evolutionary methods such as genetic algorithms may be readily used as well.

In this connection, quasi-maximally free incidentally means for the hyperset that the number of limitations to generally available objects is as low as possible, that is, that as many degrees of freedom as possible remain. Notwithstanding the demand for as many degrees of freedom as possible, however, limitations may be necessitated by certain factors such as, e.g., the constructability of modules in the target semiconductor implementation, which is why the term "quasi" maximally free is chosen. Incidentally, it should be pointed out that in certain cases the quasi-maximally free hyperset needs to contain only one PAE, which then however must be largely and in many parameters parameterizable, from which by parameterization many mutually distinct PAEs are derivable.

The final result is thus a program from a multitude of functional blocks, which are indicated in FIG. 2 as f(n) for different n.

On the basis of this program, which was already generated with recourse to hyperset elements from the high level language program and was thus generated in a manner according to the present invention, novel with respect to the related art and in a manner regarded as in accordance with patent for itself, a further improvement may now be achieved. First it is possible (proceeding to the right in the illustration) to select certain of the program parts for processing on the hardware later executing the program not by elements provided for general purposes, selected from the hyperset and determined by parameterization etc. entirely in their hardware construction, which, programmable or configurable, are available also for quasi any other task to be processed in the reconfigurable field, but to be implemented individually and/or jointly in a hardware system specialized and optimized or optimizable by dedication. In FIG. 2, program parts f(3), f(n), f(n−2) are selected for this purpose. Typically, such program parts may and will be configurations or configuration parts or an individual configuration for an XPP field or the like, which is composed of an at least partially reconfigurable set of elements such as ALU-PAEs, graph-folding PAEs, function PAEs, MAC PAEs, RAM PAEs, ROP PAEs and/or input-output PAEs, which are described in the hyperset or describable by the latter, in particular completely describable by parameterization. The selection of the type of modules to be implemented may occur in various ways; the following possibilities being mentioned only by way of example, it being obvious that it is possible and preferred in a practically preferred embodiment of the present invention not to fall back exclusively on a single one of the possibilities, but rather to provide multiple or all of the possibilities for simultaneous or successive implementation as hardware module of program parts:

- selection of program parts by hand, which may be done particularly by inserting suitable text passages in the program code such as, e.g., by inserting control characters;
- selection of those program parts that occur and/or must be executed particularly frequently in the entire program code or in a multitude of program codes, which are to be executed independently of one another on the hardware to be produced, will probably come to be executed, that is, a selection according to execution time and/or execution frequency;
- modules, from which one is able to ascertain that with respect to other elements they are otherwise executable only with difficulty or at a higher clock frequency, that is, program parts that prove to be critical with respect to performance; the selection of such program parts may be preferred so as to be able to execute certain program parts on a certain piece of hardware at all;

selection of program parts, which otherwise would generate a particularly high power loss on the hardware to be produced;

program parts, which could result in a particularly high surface area requirement of the hardware chip;

selection of program parts according to heuristic methods, which allows, particularly on the basis of the program code, for a—even for itself possible—parameterization; and selection of program parts by profiling or comparable techniques; it may be provided either to identify on the basis of a source code analysis those parts for which dedicated hardware modules are particularly suitable, for example with a view to the above-mentioned parameters with respect to executability, implementability etc. Alternatively and/or additionally it is possible to perform a profiling during the execution of programs. For this purpose, an analysis may be made as to which program parts, subprogram parts, configurations, configuration parts etc. are subject to a particularly frequent execution, are performance-critical, surface area-critical, require many and/or long memory accesses, are particularly frequently used in various configurations etc. The advantage of such a profiling lies in the fact that for typical applications that call up a multitude of programs, for example the application of a processor as a general purpose processor on a server, a laptop or a workstation, processors, co-processors and the like may be defined that are optimized for a or typical user(s). To be sure, it is possible to perform such a profiling on a simulator as well, but the particular advantage of the present technique of the top-down approach is that initially an already highly performing chip, which is thus specifying real time conditions, may be used, which does not compromise a user whose profile is to be detected, is made available. Thus, by using the target architecture, it is possible to detect how it may best be subjected to a design change process without performance losses, but rather while improving the performance with respect to critical parameters. It is pointed out that, apart from the circuits described here, corresponding precisely to the later desired architecture by the definition of hardware modules, the idea of starting from the actual target architecture for defining modified circuits by selecting particular program parts and described definition of the hardware parts is regarded as inventive for itself; in particular, the submission of partial applications and the like is reserved for this purpose and/or for parts of these aspects. Reference should be made to the possibility of performing a successive processor improvement by transmitting a multitude of profiles to a central unit, e.g., a processor manufacturing firm, in particular by transmission over the internet. This may be used, e.g., for standard programs and for other processors.

In this connection, it should be mentioned incidentally that by taking the data obtained by profiling a manual selection may be made and/or an automated selection.

It should be mentioned that in the selection it is not necessary always to pay attention only to one parameter. Rather, it may be possible, for example by recourse to methods of fuzzy logic, to take into account multiple or all of the above-mentioned influencing parameters, particularly with a suitable weighting and/or in an nonlinear manner. The selected program parts are initially on the already known PAEs existing in the hyperset, which incidentally may include, in addition to the previously mentioned PAEs, also PAEs that are made up of a combination of the functionalities of the above-listed PAEs, that is, for example, a parameterizable or parameterized PAE having a parameterizable set of ALUs of parameterizable bit width and parameterizable range of function, it being possible for this PAE to include additional graph-folding, parameterizable elements, just as function-folding, parameterizable elements parameterizable with respect to the bit width for example and/or in particular parameterizable memory areas having pointers and/or command-control line of one or multiple ALUs, or other data-modifying parts in the PAE, in order to implement sequencers or microprocessors, input-output elements and the like.

Figure 3:
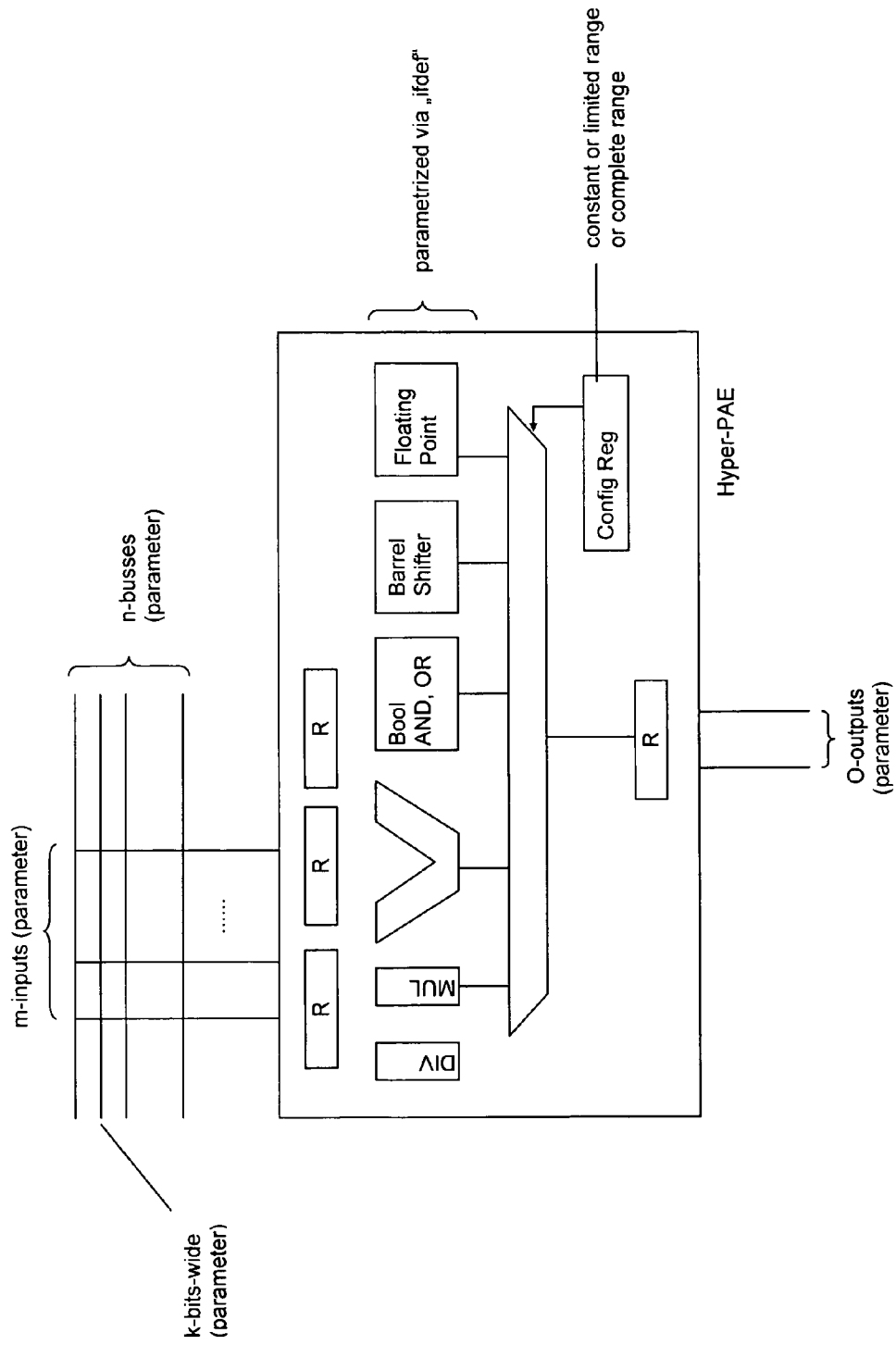
FIG. 3 shows a parameterizable hyper-PAE according to an example embodiment of the present invention.

An example of a still parameterizable hyper-PAE is shown in FIG. 3. There one finds various parameterizable units such as, e.g., bus inputs having m inputs, m representing a parameter, that is, m different operands may be supplied to one PAE. The buses are respectively k bits wide, k in turn representing a parameter, and n different buses are provided, from which the m different inputs are picked off. The total number of buses, n, also represents a parameter. Within the PAE, different operand-combining units are then shown by way of example, in the exemplary embodiment shown in FIG. 3 for example a divider having a combinatorial network, a multiplier, an ALU stage, a Boolean logic, a barrel shifter stage as well as a floating point unit. It should be pointed out that the aforementioned units in turn are parameterizable, for example with respect to the operand width, that is, they may be, e.g., 8 bit, 16 bit, 32 bit or 64 bit stages or obviously stages of other bit width as well, it being additionally possible for the range of function, for example of the ALU, the floating point unit etc. to be defined via parameters. It should be pointed out that for reasons of simplicity of the drawing certain, omitted elements, which possibly may also be provided in a hyper PAE such as sequencer units, function-folding PAEs, compare PCT/EP 03/09957, may be provided. It should be mentioned that memories of parameterizable width and depth may also be provided etc. In this connection, reference is made in particular to the previous applications of the present applicant, in which a multiplicity of different logic elements such as also FPGA-like structures, SIMD units etc. for PAEs are disclosed, this disclosure being incorporated in its full extent.

Regarding the parameterizable range of function, the flow point unit may be, only by way of example, a floating point unit that is capable of at least one, preferably several of the following combinations in the still parameterizable definition: multiplication, addition, subtraction, division, floating point combination, look-up tables, possibly having an interpolation option for certain functions such as trigonometric functions (sine, cosine, tangent), sequential calculations as for Taylor series, it being possible for special hardware to be provided for certain approximations/interpolations and it being possible preferably in addition for a parameterization of the floating point unit to be provided with respect to the data word width in the mantissa and/or exponent.

A parameterizable library for such a hyper PAE may have recourse, for example, to a procedure in which so-called ifdef constructs are used. These supply certain program segments to a translation (in hardware circuits, which must be actually provided on a chip) only if corresponding definitions are provided for this, for example by specifying the parameters, for example the range of function. It should be mentioned that this is also possible for variables and elements of the hyper PAE such as the configuration registers specified also at varying depth, possibly the protocols (compare RDY/ACK, credit protocols, RDY/ABLE etc.) capable of being implemented on a PAE, just as the parameterization of an output, different multiplexer stages in a PAE etc.

In order to achieve the desired improvements either with respect to some of the previously selected critical criteria such as power consumption, surface area efficiency or execution performance and/or a particularly great improvement in at least one of the areas combined with at best a partial improvement of other areas or a complete disregard of the same, for example, if in high performance-critical program parts, power and/or surface area do not matter, a preferably automatic and/or partially automatic converter step is now executed in a preferred embodiment. This is indicated in the figure as NML2V and represents a converter step by which a hardware language description is determined for the program parts that were selected, possibly by taking into account the reason for the selection. In light of the fact that the program parts for the hardware modules were selected with reference to one or more elements in a hyperset, it is possible to find an identical translation, that is, it is ensured that no errors occur in the conversion into a hardware-describing code such as VERILOG, which, if this is desired, may be confirmable by intermediately executable simulation steps. Thus, one first obtains a hardware-describing code, e.g., a VERILOG code, which has the corresponding functionality of the parameterized PAE in the investigated configuration(s).

Surprisingly, the use of hyper PAEs in the definition of the program parts, which are then used for implementing hardware modules, proves to be nondisruptive for the converter to hardware code. The reason for this is that certain of the parameterizable characteristics such as the bit width of the PAE, for example, must already be determined when determining the actual program for the transformation compiler, while other characteristics such as the actual ranges of function for example, that is, for example the provision of a divider stage, a multiplier stage, and adder stage and/or a subtracter stage in an ALU-PAE do not yet have to be defined. In other words, simultaneously with the transformation compilation the quasi-maximally free hyperset is reduced to a parameterized and/or partially parameterized hypersubset, in particular fewer degrees of freedom being specified, that is, no modification being required. In this instance, the bus widths to the cells may already be defined for example. It should be mentioned that the already defined parameters, which were defined in the transformation compilation for example, are made available to the NML-to-VERILOG converter or, more generally, to the hardware language description-generating converter, which may be done by corresponding indications on the program parts, for example in the form of comment lines and/or by data separated from the actual program part. The transformation compiler is thus designed for the generation of parameterization information of hardware on which it is to be based. In contrast to conventional compilers, hardware-describing code, that is, code describing degrees of freedom, is also generated.

The program parts, for which a hardware module is to be implemented in an optimized manner, now not only have parameters defined with respect to the PAEs, but rather it is at the same time clear in which configuration a certain PAE is to be operated in the program part that is to be converted to a hardware module. This configuration now has the consequence that it is, if applicable, immediately clear that certain parts of the PAE are not used, which is the case for example if in the transformation compiler a floating point unit must still be provided for other program parts, but no floating point operations are required in a currently considered program part that is to be translated into a hardware module. The configuration that is defined for purposes of the present consideration (bearing in mind that multiple configurations to be processed successively may be present in the PAE for sequencer-like PAEs or PAEs operated in a sequencer-like manner) thus indicates that certain units are not required and it is then possible to ascertain that for example a multiplexer connected downstream from an operand combination stage, which is used to select which operand combination unit should set its output or outputs to an output region, is dispensable or partially dispensable. The multiplexer typically situated behind the multiple operand combination units of a typical PAE may thus as a rule be readily simplified in a given hardware module. An invention per se is likewise seen in the removal of multiplexer stages and/or complete multiplexer units in the determination of hardware modules with recourse to hyper PAEs or a quasi-maximally free set of hyper PAEs. It should be mentioned that the removal of elements not required in a configuration to be executed in a PAE may occur by the NML2V converter, that is, in the isomorphous hardware simplification means, and/or that the selection of hardware elements to be removed as not required may also be performed by way of a synthesis. Incidentally, it should be pointed out that in the hardware module or the parts intended for the latter the configuration register does not necessarily have to contain only one constant value as was, e.g., depicted for reasons of better illustration. Rather, particularly if wave-like changes or reconfigurations of the operating mode and/or conditional changes of the operating mode of an individual element are required for the hardware module, for example as a function of data processing stages above or below, multiple possible configurations may be stored in the configuration register. The selection among such previously stored configurations, which are disclosed by the applicant in other applications, is pointed out in a manner fully incorporating by reference, compare in particular, although not exclusively, PCT/DE 98/00334 (PACT08/PCT). Incidentally, it should also be pointed out that not only trigger vectors etc. are transmittable, but possibly, within the hardware module and/or from outside in an accordingly limited range of function, also data are transmittable directly to a unit, which may be regarded as configuration data, work instructions (commands etc.) and/or which may contain respective instructions, in particular set between operands. Incidentally, it should be pointed out that the hardware module may also be defined in such a way that freely definable configurations are still executable on the defined hardware module, these freely definable configurations then in each individual element accessing a reduced set of functions and/or a limited connectivity, for example only with respect to next-neighbor connections instead of global bus connection extending over many cells being possibly provided between the individual elements of the thus defined hardware module, whereas nevertheless a multidimensional, that is, also possibly clearly more than two-dimensional connectivity and/or a toroidal, even multi-dimensionally toroidal connectivity is feasible.

The hardware description code of the NMLV2 converter thus generated preferably automatically is now still optimized in a particularly preferred variant of the present invention. The aim of this optimization is on the one hand to allow for the elimination of the registers, combination units etc. in a parameterizable PAE that are not required for the respective functionality; reference being made in this connection to the earlier applications of the present applicant, compare PCT/EP 03/08080 (PACT30/PCTE) and PCT/EP 03/08081 (PACT33/PCTE). These provided for a configuration of a field or of an individual PAE to be defined once by the use of fuses, that is, breakable elements and the like in order to allow for a problem-free construction of chips having ASIC functionality without the requirement of a mask construction for each ASIC embodiment; although in this previously known variant possibly not required elements of functionality remained in the ALU or another unit of a PAE. If, for example, a PAE having an ALU, which included a subtracter, a divider, an adder and a multiplier, was configured in a fixed manner in order to provide an adder, then the silicon surface area used for producing the multiplier had to be provided nevertheless. The present application and invention among other things in one of its aspects aims to avoid this, which contributes toward a reduction of the size and thus possibly also of the execution speeds of a dedicated hardware area. The corresponding changes in the parameterizable and already partially parameterized hyper PAE take place in a retiming stage, in which initially unnecessary registers are removed. The removal of the registers first results in a decapsulation of functional parts previously encapsulated by the use of the PAE definition. This is by no means critical, however. On the contrary, in the case of a suitably intelligent design chain, it is rather very advantageous.

The design chain hereby provided according to the present invention inherently features the intelligent layout, which renders obsolete the complex encapsulation required in the related art, for example by input-output FIFOs and/or registers, which are practically controllable only via suitable protocols such as RDY/ACK protocols. For this purpose, e.g., initially the internal registers are removed, that is, the registers situated between the considered cells at their mutual junctions. The removal of the registers, however, does not occur blindly for all registers, but rather there is a preferably readily automated selection of registers that are removable or that must remain in the piece of hardware. First, constants should remain in the piece of hardware. Further, it is strongly preferred if registers for preloading values (PRELOAD registers) are not removed. Additional registers are initially not required in a given implementation of the method.

This obviously changes the timing behavior or the overall system. Now, the present invention provides for the registers to be removed nevertheless, but for a synthesis step to be performed in order to ensure a correct timing of the data processing by the considered piece of hardware. Preferably, therefore, a synthesis step is performed according to the present invention. This also applies to the inputs/outputs of the hardware module to be constructed.

It should be pointed out that by and for suitable logging bus-internal registers may readily be used, that a feeding-in/reading-out of data in RAM-PAEs having sufficient memory depth is possible and/or a reading-in/reading-out of data in the preload memory, if required at all, may occur, or the provision of input-output registers at the end and at the beginning of the piece of hardware, unless for example the long-familiar FORWARD-BACKWARD registers are also to be provided for purposes of use by other PAEs. In a preferred design, constant contents of RAMs are implemented by ROMs or mapped onto ROMs.

The removal of the registers will now change the timing behavior. Initially, the frequency behavior of the considered circuit to be provided may deteriorate, possibly even significantly. This may be compensated by again inserting registers in suitable places, which are either arranged according to fixed rules, for example by inserting less deep register stages in places where previously deeper register stages were provided, by inserting register stages of the same depth as those that were previously removed, or, particularly preferably, by considering the signal run times through the remaining hardware circuits in order to identify places at which registers are required to increase the frequency; one skilled in the art being able to perform such a procedure per se without deeper explanation.

It must further be kept in mind that, while the considered software part may be regarded as initially balanced, balancing is normally performed or could be performed by providing register stages between different data-processing functionality areas in or between the PAEs etc. The initial removal of the registers now impairs the possible or already given balance of the data-processing paths, which must be coupled at certain points. In another register insertion step, the attempt is now made either to arrange the registers already provided again in such a way that not only the possibly demanded and required frequency increase is obtained, but rather at the same time also a data run time balance is achieved. Thus an automatic balancing in the retiming means by register insertion is brought about by retiming only on the basis of program parts possibly to be made into hardware modules, in which it is pointed out that certain data paths are to be balanced against one another.

Something else has to be kept in mind as well when retiming: The hyper PAE, even in the case of a given parameterization, will normally still include functionalities that are not required in the hardware module. For example, it would be conceivable that a hardware module is written for a program part in which no divisions are required at all. In this case, a divider stage could be omitted in a PAE. A division now requires a certain delay, that is, a run time across the module. This will be significantly greater than for example the run time across an adder stage. The primarily given data run time balance of the parameterized or hyper PAE will be such that the run times of a divider stage are taken into account as well. If, however, in a hardware module at a certain point a divider stage is no longer required, which is discernible, then such non-required unit may and preferably will be removed from the PAE, which then changes the delay of the data run through the unit. The hardware module should also be adapted accordingly when retiming. Fundamentally, it should be pointed out that this is not absolutely necessary, however. A certain advantage is already obtained if between the individual stages of a hardware module composed of multiple hyper PAEs non-required register stages are removed. In the preferred case, however, non-required parts are also removed from the hyper PAEs, which may occur during the synthesis, for example, such as, e.g., the removal of a divider stage discussed above, other stages such as memory stage elements, multipliers, floating point units etc. being also removable, if indicated. This too may be taken into account when retiming. For this purpose, a synthesis is preferably performed, by which the timing behavior is analyzed in an automated manner in order then either automatically to insert registers in required places and/or to provide indications where a programmer should insert registers in order to ensure a proper timing behavior.

Incidentally, it should be pointed out that divider stages were mentioned above. With regard to this and to the removability of register it should be pointed out explicitly, although exemplarily, that on the one hand protocol-relevant and data communication-relevant registers may be provided in a module or array; such being readily removed at first. Precisely the division shows, however, that certain registers shall not and/or cannot be removed. The division may be implemented in two ways if a division stage to be provided in hardware is to be constructed. The first possibility provides for a combinatorial network, in which no registers are required. The second variant provides for a sequential division, in which a value is computed iteratively again and again, comparable to the manual computation of a division. In the latter case, intermediary results must be written into registers. These must not be removed when retiming since they are algorithmically required. The non-removal may be brought about, e.g., by indications in the hardware-defining code of the hyper PAE, which may lead to comments in a compiler code of the transformation compiler that are not required for actual program purposes. Alternatively and/or additionally, variants are conceivable, in which first a removal and subsequently a reinsertion may be performed.

In a particularly preferred variant, therefore, the hyper PAEs may be marked as to whether certain registers are algorithmically required such that they are not automatically removed in an initial removal of the registers. Alternatively and/or additionally, when removing superfluous registers, analyses may be performed to the effect that registers having a feedback to circuit regions located upstream of the data flow are not removed. For such registers are automatically algorithmically relevant registers. It should be pointed out that even algorithmically required registers are obviously removable if the algorithm with which they are associated is not executed; something that happens for example in the case of a sequential division generally provided in a hyper PAE if the division per se is not implemented in the hardware module to be constructed. Incidentally, it should be pointed out that feedbacks are implemented in the standard PAEs provided by the applicant by backward registers. If these are actually required in a given program part, it is advantageous not to remove them or not to remove them without verification and/or not to remove them completely.

Figure 4:
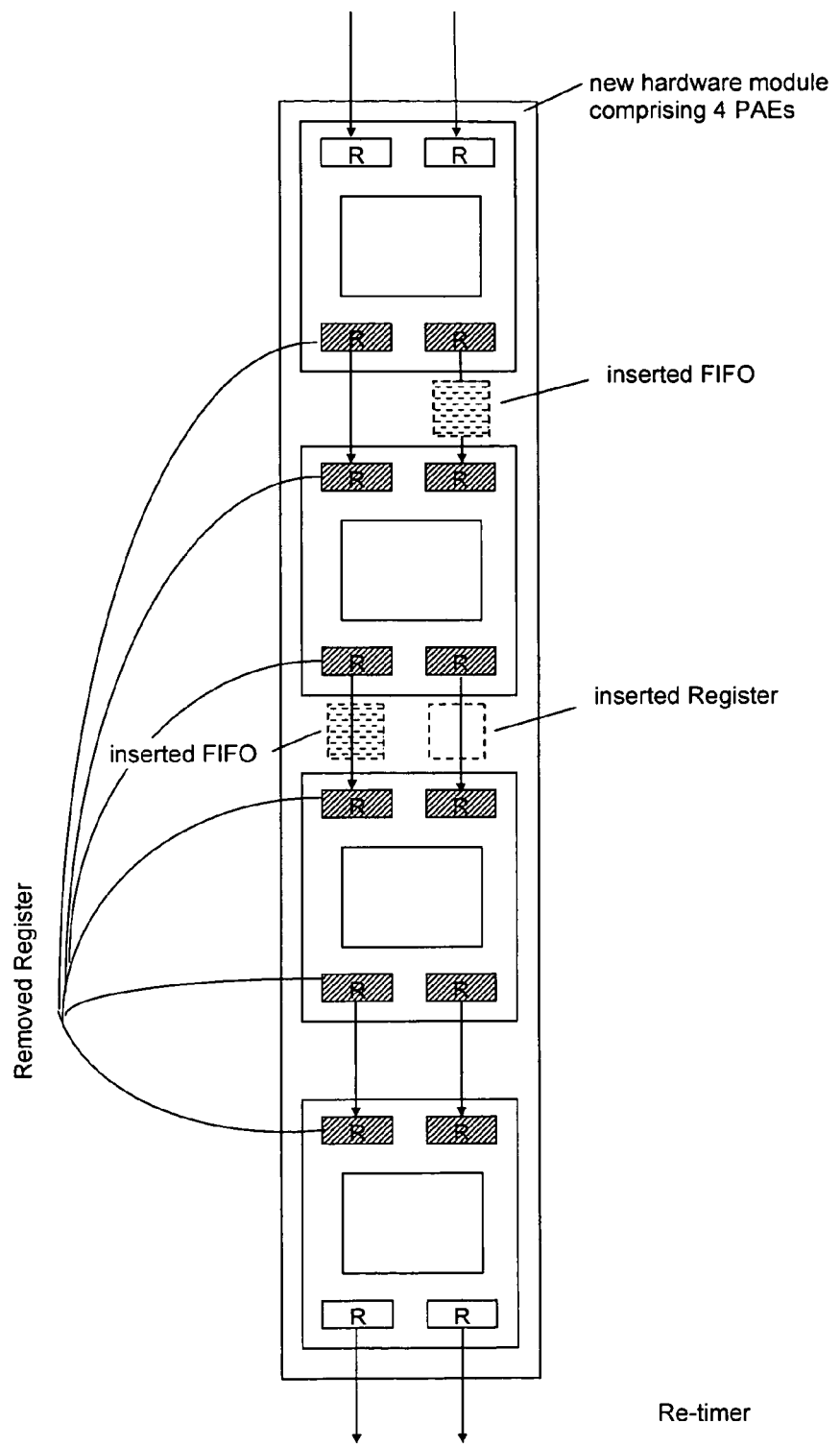
FIG. 4 shows insertion and removal of registers according to an example embodiment of the present invention.

If indicated, registers are then inserted with the retimer. It should be mentioned that it is in principle possible to insert the registers at any place in the hardware module, as required. In particular, if performance efficiency is the sole concern, then it is possible to insert register within a (parameterized) hyper PAE that is provided in the hardware module. It should be pointed out, however, that a simpler method of register insertion is obtained if on the interfaces between multiple hyper PAEs in the hardware module to be designed again those registers or a part of those registers are inserted, which were initially removed. The reason for this is to be seen in the fact that an optimum insertion in these places is possible for the reason that the entire starting definition of the hyper PAEs is selected to be such that an insertion is automatically possible in these places. Reference is made to FIG. 4, which shows how initially registers are removed for an only exemplarily pipeline-like, only exemplarily unbranched hardware module. These are shown as "removed registers" in a shaded manner. In the hyper PAEs, which are drawn upon in the parameterized form of the hardware module description, these registers are the input/output protocol registers, that is, for example the FREG/BREG of the hyper PAEs. Alternatively it is possible to provide PAEs without FREG/BREG only with those registers that are provided in the direct coupling path of the ALUs and other logic elements for operand combination in the PAE in the connections to the buses as protocol registers. Reference is made in particular to OREG and PREG from PCT/DE 97/02949 (PACT02/PCT). The newly inserted registers, which ensure the balancing or the desired performance/surface area efficiency/latency following the removal of the shaded registers, are drawn in FIG. 4 by dashed lines and indicated as "inserted register" or for multistage registers as "inserted FIFO."

It should be pointed out once more that the represented insertion of registers, FIFOs and the like between the predefined hyper PAEs not only simplifies the structural layout, but also facilitates the verification and calculation of the delay times across the circuits provided in the hardware module since the run time behavior etc. of the underlying elements may be assumed as well-known in the register removal step or the retiming step, which facilitates a possibly iterative approach to the retiming task. In addition, the insertion of registers between the previously used and underlying (parameterized) hyper PAEs is particularly surface area-efficient since, e.g., the use of general ALUs in the hyper PAEs would there require a multitude of registers even though the insertion would readily be possible there as well, for example in order to achieve particularly high frequencies. In addition, there is hardly a positive effect in a cut within an ALU or a PAE core.

Incidentally, it should be mentioned that it is readily possible to design a hardware module in such a way that it has to run at a different working frequency than that provided for an XPP field or another reconfigurable unit field. On the one hand, it is possible to select the frequencies to be lower, for example to reduce latencies, to reduce the surface area and/or to reduce the power consumption. For the sake of completeness, it should also be disclosed that for lowering the power consumption it is also possible, if indicated, to work with other hardware definitions such as for example different gate thicknesses of transistors in comparison to a reconfigurable, processor field to be likewise provided. As an alternative to the purely power-saving considerations, it is also possible in certain cases to design the hardware modules for a certain frequency, which may be advantageous especially if a particularly high data throughput is required in the hardware module and/or if highly computing-intensive tasks must be processed in it.

Incidentally, it should be pointed out that the register stages or FIFO stages to be inserted or to be newly introduced or reintroduced are usable not only with a view to, e.g., latencies, but rather also in order to restore a balance of data flow paths possibly destroyed by the initial removal of registers. It should be pointed out that initially after removing the registers a balanced data path automatically exists, but that possibly timing conditions are not maintained; and that then initially the timing behavior is restored by inserting additional registers, but that because of that the balance between the individual data paths may be disturbed. In order to restore the balance as well after having restored the timing conditions and timing requirements, recourse may be taken readily to the techniques for balancing from the related art, particularly to those stemming from the applicant, by using in particular precisely those algorithms to which recourse is taken also in the construction of compilers such as for an NML compiler for computing executable configurations. Reference is made in particular to the applications PCT/EP 02/10065 (PACT11/PCTE), PCT/EP 02/06865 (PACT20/PCTE), PCT/EP 03/00624 (PACT27/PCTE), PCT/EP 2004/009640 (PACT48/PCTE). In these applications suitable methods for balancing are described.

The output from the retimer is then a hardware code definitely executable by recourse to the hyper PAEs or elements of the quasi-maximally free hyperset, which is frequency-optimized and/or throughput-optimized through the retiming. In addition, the surface area is automatically optimized. The definition thus obtained of new hardware areas as hard modules may now be integrated into the XPP library. There are many possibilities for the thus determined hardware module functionalities to be integrated into and/or be connected to an XPP field or, more generally, a field of reconfigurable and/or partially reconfigurable elements. One possibility, for example, is to provide a complete PAE, which does not have an ALU or an individual sequencer as central functionality, but rather the specified hardware functionality of the hardware module. In this instance, it is particularly preferred if in such a PAE, as is provided in PCT/EP 01/08534 (PACT14/PCT), an outwardly identical geometry and in particular a connection geometry is provided, as in other PAEs of the field. This has the great advantage that the homogeneity of the field remains largely unimpaired. Alternatively and/or additionally, it is possible to achieve a connection without a corresponding consideration of form factors and the like, compare DE 102 36 269.6 and DE 102 38 172.0-53 (PACT36 and 36I), by setting the specific hardware modules next to the actual field. For this purpose, it is possible to provide for an integral manufacture and/or to manufacture the parts separately and then to let them communicate via buses, via RAMs and the like with the reconfigurable field, compare SOC technology etc.

Other possibilities of connection are described in the figures.

Figure 5B:
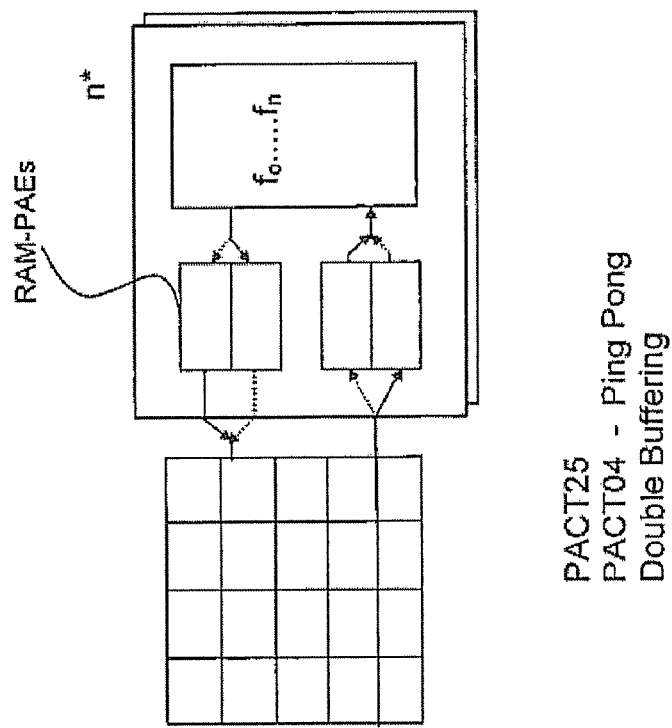
FIG. 5b shows a connection of an element array to a hardware module with RAM memories as coupling elements according to an example embodiment of the present invention.
Figure 5A:
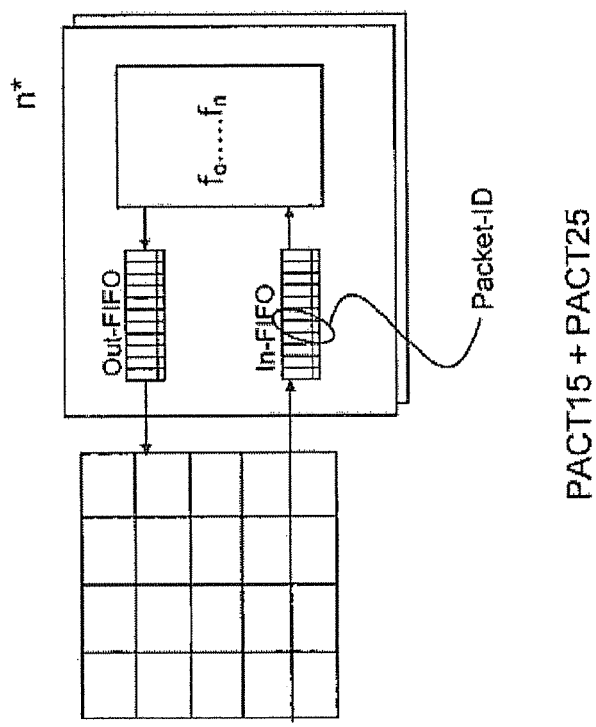
FIG. 5a shows a connection of an element array to a hardware module by way of FIFO memories according to an example embodiment of the present invention.

FIG. 5a shows on the left a combination of an XPP field or an FPGA field with a hardware module of the present invention, the connection of the hardware module to the field occurring via FIFO memories in the input path and/or output path, preferably via FIFOs in both paths. By providing a FIFO memory between the or each hardware module of the present invention, a decoupling is already achieved in principle, which allows for a more independent procedure and a deviating timing etc. especially with respect to the processing speed.

It is particularly advantageous, however, if the exchanged data packets are given identification information in the form of a packet header or additional identification bits on each individual word or the like. In this manner it is possible, for example, to execute different tasks in a multithreading, hyperthreading, multitasking, timeslotted or other manner either with the hardware module and/or the XPP or FPGA field or another field and then, in spite of the comparatively loose coupling effected via the FIFOs, to ensure nevertheless that an exchanged data packet or data word undergoes the correct processing in the receiver, that is, in the hardware module or the XPP field or the like.

It should be mentioned that it is already helpful if identification information in the hardware module remains unchanged and/or is changed only in such a way that the associated data packet is processed in the manner provided following the return of the processing result to the receiver, that is, for example the XPP field, for example in that it is processed further using the correct configuration.

Alternatively and/or additionally it is possible, however, to co-transmit, in place of pure identification information and/or in addition to the latter, also control instructions or the like, in order to choose for example in marginally changeable hardware modules, whether an addition or a subtraction of consecutive operands is to be performed and the like. In this manner, an increased flexibility of programming all the way to self-modifying code may be achieved.

FIG. 5b shows how for coupling a hardware module in the input path and/or output path it is possible to provide coupling elements in the form of RAM memories, in particular even of RAM PAEs, rather than in the form of FIFOs. This makes it possible in particular to provide respectively dedicated memory areas both for writing data from the field for the hardware module as well as when writing from the hardware module for the field, that is, when transferring data from the field to the hardware module on the one hand, and when (here:) returning results from the hardware module to the field on the other hand. This facilitates on the hand the handling of different configurations and on the other hand allows for example for prioritizations in that work, that is, reading and writing, is performed primarily and preferably in a first memory area, and only if a data processing has been performed sufficiently often in the first memory area and/or no data are present there, will recourse be taken to other memory areas and thus other tasks.

Incidentally, it should be mentioned that in those places in the present document where there is talk of data input from the XPP field and the transfer of the result to the latter, an opposite course is possible as well in that the hardware module may use the XPP field as a more flexible data processing element and/or where mixed forms are possible, that is, where data are shifted back and forth in ping-pong-like fashion or in a less regular manner for overall processing.

Figure 6B:
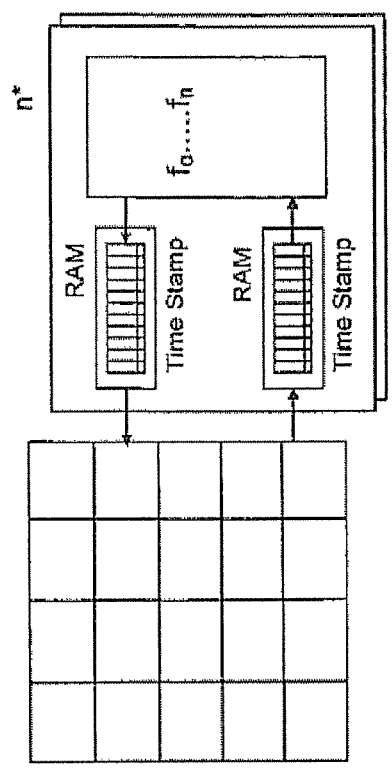
FIG. 6b shows a connection of an element array to a hardware module by way of RAM memory, where temporal priority or validity of a data packet is transmitted, according to an example embodiment of the present invention.
Figure 6A:
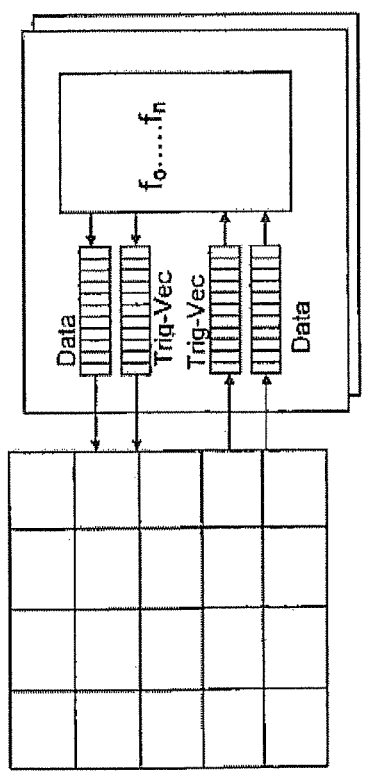
FIG. 6a shows a connection of an element array to a hardware module by way of FIFO memories, where trigger vectors are transmitted, according to an example embodiment of the present invention.
Figure 7:
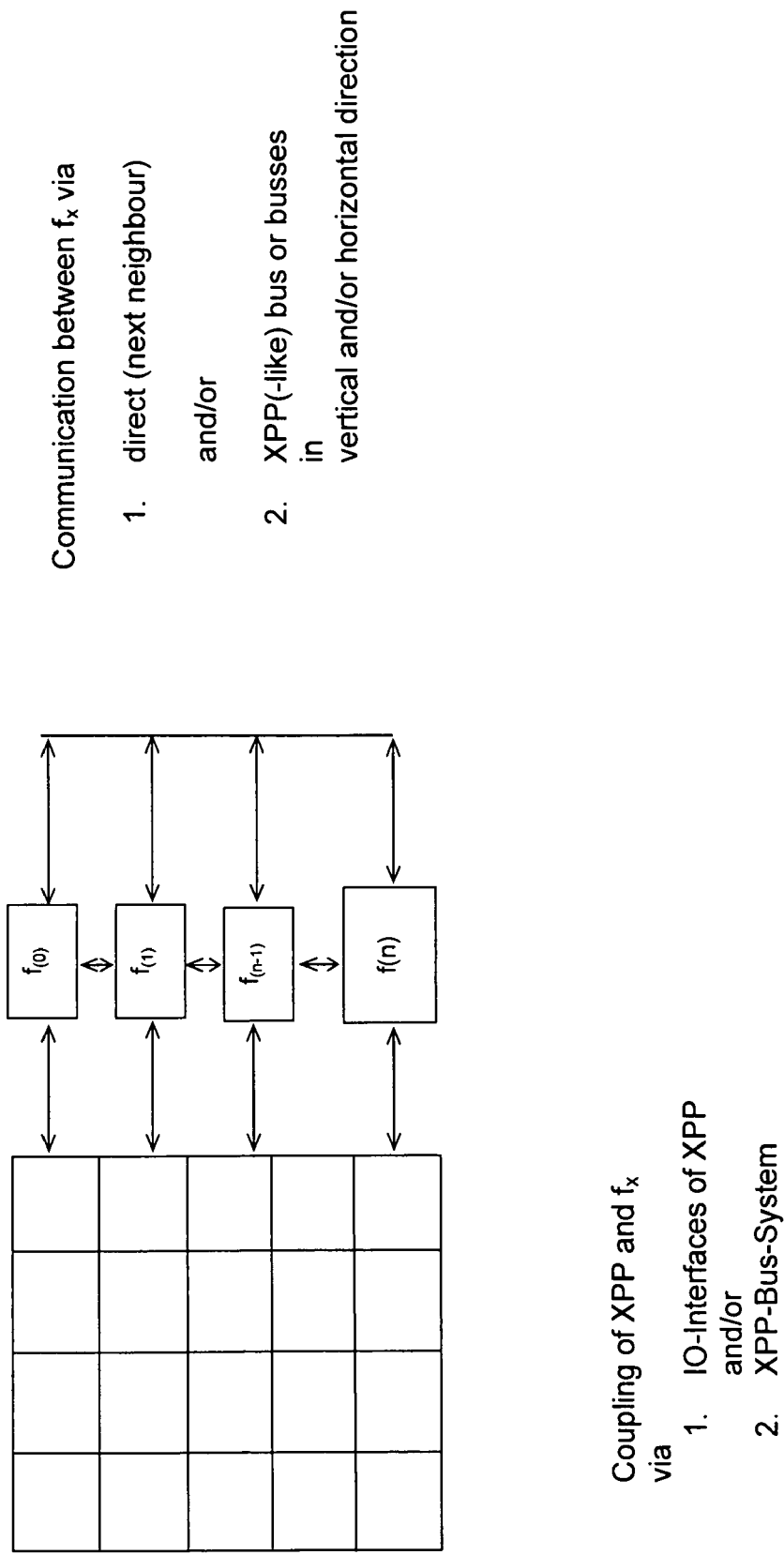
FIG. 7 shows a coupling arrangement according to an example embodiment of the present invention.
Figure 8B:
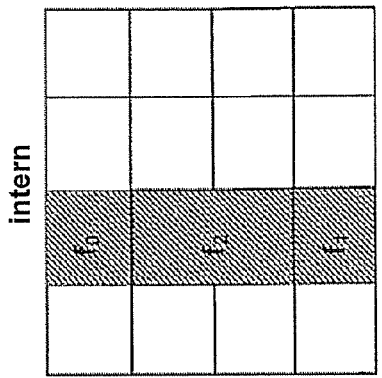
FIGS. 8a-8d show spatial arrangements of hardware modules with respect to an XPP field, according to an example embodiment of the present invention.
Figure 8A:
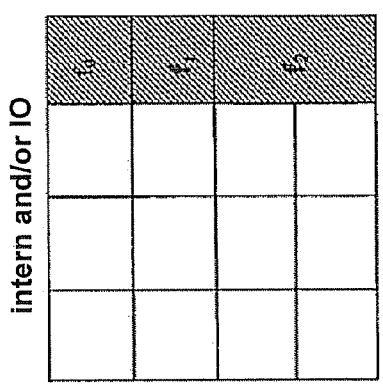
Figure 8D:
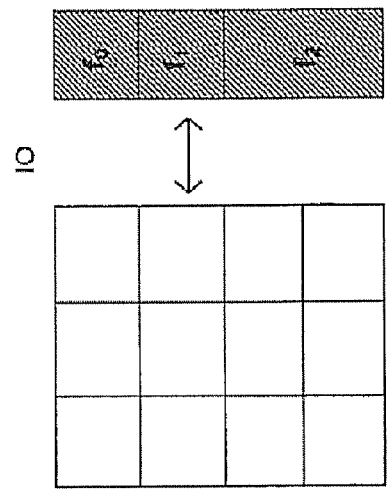
Figure 8C:
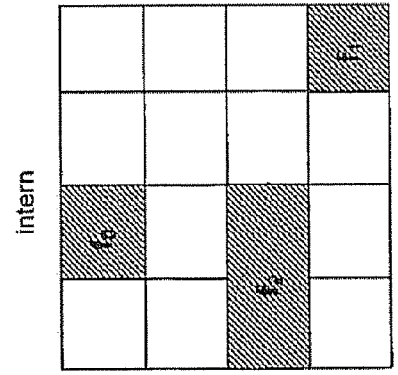

FIG. 6a shows a variant in which again data are exchangeable via FIFO memories and in particular again FIFO memories are present either in the input branch and, preferably or also in the output branch. In addition, trigger vectors are now transmitted. Regarding the significance and application of trigger vectors, reference is made to WO 98/35299 (PACT08/PCT). The combination of identification information with programming information and/or trigger information or status information, which are exchanged in order to trigger certain data processing events or processes, should be mentioned once more explicitly.

FIG. 6b shows that in the data exchange, a "time stamp", that is, information regarding the temporal priority or the temporal validity of a data packet is transmitted as well. In the present case shown in FIG. 6b, this transmission occurs in read-write memories (RAMs). The time mark that is co-transmitted may be used to select those data packets, which are to be processed next.

It should be pointed out that in this manner the data processing may be controlled particularly favorably. The actual procedure of transmitting time marks along with a data word or data packet in data flow processing was already described in WO 02/071249 (PACT18/PCTE, butcher protocol). Irrespective of the fact that document WO 02/071249 is in its full extent incorporated by reference for disclosure purposes, it should be pointed out explicitly that the assignment of a time mark to data packets allows for both a data sequence to be reconstructed and/or restored at any later time as well as for operands to be combined with each other as required, which is advantageous particularly if branches supplying operands are balanced with respect to the latencies.

It should be mentioned that in the manner in which for FIG. 6b reference was made to WO 02/071249 (PACT18/PCTE), with the other figures reference is made to WO 02/071248 (PACT15/PCTE) and WO 02/071196 (PACT25/PCTE) for FIG. 5a as well as WO 02/071196 (PACT25/PCTE) and WO 98/29952 (PACT04/PCT) for FIG. 5b as well as WO 98/35299 (PACT08/PCT) and WO 02/071196 (PACT25/PCTE) for FIG. 6a, and that all of the mentioned documents are respectively incorporated in their full extent individually and in combination for disclosure purposes.

It should be mentioned that incidentally the coupling methods mentioned and disclosed here are also combinable, for example by connecting a FIFO upstream to a RAM-PAE while co-transmitting time marks in parallel and the like.

It should be mentioned that as far as the physical connectability of the hardware modules is concerned, the latter may be connected either by integration into the internal bus system of the XPP or of another processor field and/or via external, possibly bundled input/output lines. The possibility should be pointed out of combining a multitude of individual input/output lines to form buses in order to obtain a coupling of the hardware modules for example in finely granular fields. In this connection, reference is made to WO 02/29600 (PACT22aII/PCTE) and the parallel patents connected with this by way of priority, which are all incorporated to their full extent for disclosure purposes.

With respect to the spatial arrangement of hardware modules or hardware parts of the present invention in XPP fields or other fields, FIG. 8 shows that these may be provided either as columns or lines at the edge of a field, it obviously also being possible for a field to be surrounded by such hardware modules or hardware parts, and/or that individual elements or field groups may be distributed over the field, as shown in FIG. 8 on the lower left. Alternatively it should be mentioned that a hardware element and/or a group of hardware elements according to the present invention could also be set next to an XPP field or other field or, assuming appropriate manufacturing processes, could be placed on top or underneath such a field. The usability by integration on a single, jointly manufactured chip should be disclosed as a possibility in the same manner as those of manufacturing the separate elements independently and connecting them. It is understood that in the variants in which the hardware modules of the present invention are connected most closely to the field because they form an interposed column, represent a column at the edge, a frame and/or elements provided in a field, the setup is preferably connected via internal buses, whereas in an arrangement next to the field a connection via I/O connectors is preferred. In the case of an arrangement on the edge, connections may be established alternatively via I/O ports and/or via internal buses. It should also be mentioned that bus lines or other lines may be drawn across the hardware elements that are set between field elements, if necessary. Hardware elements that are set into a field may also be connectable by separate lines, as required. The arrangement in columns is incidentally clearly preferred, a positioning of the column at the edge or in between being preferred depending on for what purposes a data processing unit having a hardware part of the present invention is to be used.

In a preferred variant, the number of hardware modules will be selected in such a way that on the one hand the data processing tasks to be performed may be solved quickly and efficiently, and that on the other hand the form factor is observed when inserting into or next to a field.

In this connection, it should be mentioned incidentally that the hardware modules of the present invention, even when closely coupled to a field, may additionally have separate I/O connections for communication with external elements such as memories and the like, if necessary.

Figure 9:
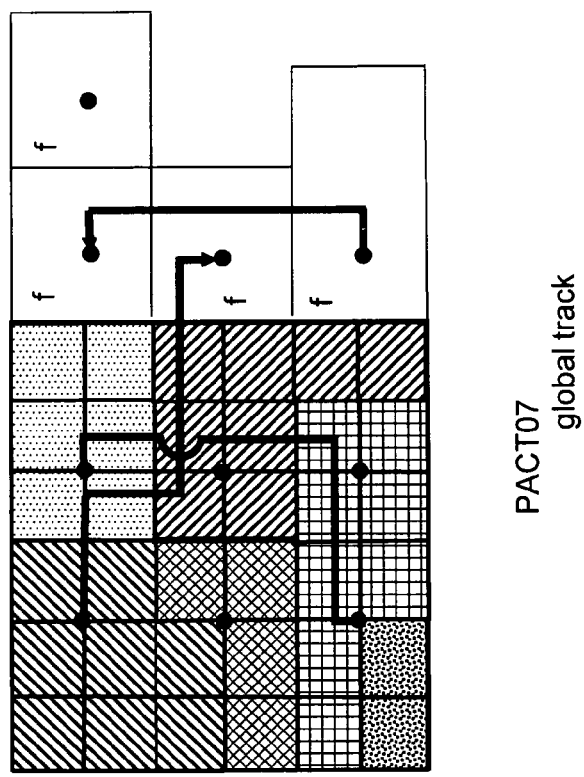
FIG. 9 shows various interconnections between hardware modules and between the hardware modules and parts of an element array, according to an example embodiment of the present invention.

According to FIG. 9, it is possible incidentally to allow for a connection between the hardware modules of the present invention among one another and/or certain field element parts, which is either permanently fixed, alternatively and preferably, however, is set up only temporarily. This is readily possible particularly when a hierarchically ordered bus system allows for global bus lines that may be set up and/or dismantled. Regarding the setup and/or dismantling of bus lines, reference is made by incorporation of its entire disclosure to the document WO 98/35294 (PACT07/PCT).

It should be pointed out that prior to building a mask for manufacturing a dedicated chip, recourse may be taken, if necessary, to an emulation, the hardware parts being emulated using FPGA. It is pointed out that the applicant has already proposed building XPP fields, in which PAEs are provided that may represent small FPGA fields. By suitable wiring of several such FPGA PAEs, the hardware structures may then be emulated, if indicated. It is then possible to emulate a verification or emulation of a personalized or customer-specific design by a suitably designed XPP test chip having FPGA PAEs.

While it was indicated above that hardware modules may be constructed by hyper PAEs arranged linearly one behind the other only by way of example, which are suitably parameterized and defined, this is not absolutely necessary. It may be advantageous not to assign to each operand combination in the program part a separate PAE and provide for a linear processing. Rather, in particular in especially complex program parts, it would also be possible to break up the program parts in turn into a multiplicity of different configurations to be processed in the hard module. In such a case, for example, it may be established, for example, that a certain cut for breaking up the program part into two configurations would be advantageous. The manner in which such cuts may be applied is known per se. Reference is made in particular to PCT/EP 02/10065 (PACT11/PCTE). If such a procedure is desired, typically the range of function of the hard module is selected to be such that the range of function at the desired place respectively corresponds to the set union of the operand combinations etc. executed or to be executed using different configurations. It should be pointed out that in a multi-configuration hard module definition, fixed configurations may be provided, if indicated, which are provided in a fixed manner in the hardware module, compare PCT/EP 03/08080 (PACT30/PCTE).

Further, it should be pointed out that if multiple configurations are to be processed successively on the hardware module, the ranges of function of the individual hard module areas, which are obtained by parameterization, that is, the definition of parameters of the hyper PAEs, are preferably selected to be such that respective computing units, considered individually, have still a minimal range of function. This may possibly occur in that the configurations that are divided are executed in such a way that multiplications are always performed in the same PAE if in each configuration only one multiplication is required, and, instead of a multiplier stage, in another PAE, the data lines to be addressed by a certain configuration, required for the return of data or the transmission of data, in particular lines to be implemented here too as next-neighbor connections, are implemented possibly at a lower surface area requirement.

What is claimed is:

1. A computer-implemented hardware definition method, the method comprising:
  analyzing, by a computer processor, software function modules of a software program; and
  generating, by the processor, for each of at least a subset of the software function modules, and on the basis of the analyzing step, a respective setting indicating whether the respective function module is to be implemented as a respective hardware module or as a software module executed on a hardware module defined in a hardware module library that includes at least one parameterizable, executable modules;
  wherein the generating, for each of at least one of the software function modules, includes:
    selecting a plurality of hardware modules from the hardware module library based on respective parameters of the respective hardware modules that correspond to the analyzed software function module;
    combining the selected plurality of hardware modules; and
    optimizing the combined hardware modules.

2. A computer-implemented hardware definition method, the method comprising:

analyzing, by a computer processor, software function modules of a software program; and generating, by the processor, for each of at least a subset of the software function modules, and on the basis of the analyzing step, a respective setting indicating whether the respective function module is to be implemented as a respective hardware module or as a software module executed on a hardware module defined in a hardware module library.

3. The method according to claim 2, wherein at least one of the respective hardware modules is a non-programmable module whose function is fixed.

4. The method according to either of claims 2 and 3, wherein at least one of the respective hardware modules is programmable in its function.

5. The method according to claim 4, further comprising: converting those of the software function modules set in the generating step to be implemented as a respective hardware module into the respective hardware modules.

6. The method according to claim 5, further comprising: adding definitions of the converted software function modules to at least one of the hardware module library and a chip definition file.

7. The method according to claim 6, further comprising: forming a chip based on a combination of the modules in the chip definition file.

8. The method according to claim 7, wherein the forming of the chip includes inserting communication channels, as defined in the chip definition file, between the hardware modules that are combined.

9. The method according to claim 8, further comprising inserting memory units into at least some of the communication channels.

10. The method according to claim 9, wherein at least one of the memory units is a register.

11. The method according to claim 9, wherein at least one of the memory units is a first-in-first-out (FIFO) memory unit.

12. The method according to claim 9, wherein at least one of the memory units is a Random-Access-Memory.

13. The method according to claim 5, wherein the converting includes generating a hardware description language.

14. The method according to claim 5, wherein the converting includes generating a hardware netlist.

15. The method according to claim 5, wherein the converting includes synthesizing the respective hardware modules.

16. The method according to claim 15, wherein the synthesizing includes setting at least one of a processing time, a path delay, and a signal delay constraint.

17. The method according to claim 5, wherein the respective hardware modules are added to the hardware module library.

18. The method according to claim 4, further comprising: optimizing each of one or more of the software function modules for execution as a non-programmable hardware module whose function is fixed.

19. The method according to claim 18, further comprising: for each of the optimized one or more of the software function modules, selecting a suitable one of the hardware modules defined in the module library.

20. The method according to claim 19, further comprising: adding the selected hardware modules to a chip definition file.

21. The method according to claim 20, further comprising: forming a chip based on a combination of the modules in the chip definition file.

22. The method according to claim 21, wherein the forming of the chip includes inserting communication channels, as defined in the chip definition file, between the hardware modules that are combined.

23. The method according to claim 22, further comprising inserting memory units into at least some of the communication channels.

24. The method according to claim 23, wherein at least one of the memory units is a register.

25. The method according to claim 23, wherein at least one of the memory units is a first-in-first-out (FIFO) memory unit.

26. The method according to claim 23, wherein at least one of the memory units is a Random-Access-Memory.

27. The method according to claim 4, further comprising: compiling each of one or more of the software function modules into executable code for at least one of a microprocessor and a microcontroller.

28. The method according to claim 27, further comprising: selecting, for the executable code and from the hardware module library, hardware modules capable of performing the functions required by the executable code.

29. The method according to claim 27, wherein the selecting includes modifying a function required by the executable code to correspond to a function of a module of the hardware module library that is more efficient than the function required by the executable code prior to the modification.

30. The method according to claim 4, further comprising: for each of one or more of the software function modules whose setting indicates that the respective software function module is to be implemented as a software module, selecting a suitable one of the hardware modules defined in the module library for its execution.

31. The method according to claim 30, further comprising: adding the selected hardware modules to a chip definition file.

32. The method according to claim 31, further comprising: forming a chip based on a combination of the modules in the chip definition file.

33. The method according to claim 32, wherein the forming of the chip includes inserting communication channels, as defined in the chip definition file, between the hardware modules that are combined.

34. The method according to claim 33, further comprising inserting memory units into at least some of the communication channels.

35. The method according to claim 34, wherein at least one of the memory units is a register.

36. The method according to claim 34, wherein at least one of the memory units is a first-in-first-out (FIFO) memory unit.

37. The method according to claim 34, wherein at least one of the memory units is a Random-Access-Memory.

38. The method according to claim 3, further comprising: for each of one or more of the software function modules whose setting indicates that the respective software function module is to be implemented as a hardware module, selecting a suitable one of the non-programmable hardware modules defined in the module library for its execution.

39. The method according to claim 38, further comprising: adding the selected hardware modules to a chip definition file.

40. The method according to claim 39, further comprising: forming a chip based on a combination of the modules in the chip definition file.

41. The method according to claim 40, wherein the forming of the chip includes inserting communication channels, as defined in the chip definition file, between the hardware modules that are combined.

42. The method according to claim 41, further comprising inserting memory units into at least some of the communication channels.

43. The method according to claim 42, wherein at least one of the memory units is a register.

44. The method according to claim 42, wherein at least one of the memory units is a first-in-first-out (FIFO) memory unit.

45. The method according to claim 42, wherein at least one of the memory units is a Random-Access-Memory.

46. The method according to claim 2, wherein source code written in a high level programming language is compiled into at least a subset of the software function modules.

47. The method according to claim 2, wherein source code written in one of a low level programming language and an assembly language is compiled into at least a subset of the software function modules.

48. The method according to claim 2, wherein the analyzing includes determining whether any of the software function modules does not meet at least one of a maximum power requirement, a performance requirement, and a maximum chip area requirement.

49. The method according to claim 2, wherein the analyzing includes determining which of the software function modules is estimated to execute with a low performance when implemented as a software module executed on a hardware module whose function is programmable.

50. The method according to claim 2, wherein the analyzing includes analyzing respective required clock frequencies of the software function modules.

51. The method according to claim 2, wherein the analyzing includes analyzing respective frequencies of execution of the software function modules.

52. The method according to claim 51, where the analyzing includes analyzing ratios of frequencies of execution of different ones of the software function module to each other.

53. The method according to claim 2, wherein the analyzing includes analyzing respective power dissipations of the software function modules.

54. The method according to claim 2, wherein the hardware module library includes at least one parameterizable, executable module.

55. The method according to claim 54, wherein the generating, for each of at least one of the software function modules, includes selecting a hardware module from the hardware module library based on a parameter of the respective hardware module that corresponds to the respective analyzed software function module.

* * * * *